United States Patent
Kang et al.

(10) Patent No.: US 6,597,608 B2
(45) Date of Patent: Jul. 22, 2003

(54) CODING CELL OF NONVOLATILE FERROELECTRIC MEMORY DEVICE AND OPERATING METHOD THEREOF, AND COLUMN REPAIR CIRCUIT OF NONVOLATILE FERROELECTRIC MEMORY DEVICE HAVING THE CODING CELL AND METHOD FOR REPAIRING COLUMN

(75) Inventors: Hee Bok Kang, Daejeon-shi (KR); Hun Woo Kye, Kyonggi-do (KR); Duck Ju Kim, Cheju-do (KR); Je Hoon Park, Kyonggi-do (KR); Geun Il Lee, Kyonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/163,351

(22) Filed: Jun. 7, 2002

(65) Prior Publication Data

US 2002/0186600 A1 Dec. 12, 2002

(30) Foreign Application Priority Data

Jun. 11, 2001 (KR) ........................ 2001-32475

(51) Int. Cl.$^7$ ............................................. G11C 29/00
(52) U.S. Cl. ........................................ 365/200; 365/145
(58) Field of Search ......................... 365/200, 201, 365/145

(56) References Cited

U.S. PATENT DOCUMENTS

| | | | |
|---|---|---|---|
| 5,227,997 A | 7/1993 | Kikuda et al. | 365/189.08 |
| 5,349,366 A | 9/1994 | Yamazaki et al. | 345/92 |
| 5,905,295 A | 5/1999 | Prall et al. | 257/529 |
| 6,078,534 A | 6/2000 | Pfefferl et al. | 365/200 |
| 6,115,286 A | 9/2000 | Zettler | 365/185.09 |
| 6,157,585 A * | 12/2000 | Kim | 365/200 |
| 6,377,498 B1 * | 4/2002 | Kang | 365/200 |

FOREIGN PATENT DOCUMENTS

| | | |
|---|---|---|
| JP | 5-119298 | 5/1993 |
| JP | 9-128991 | 5/1997 |

* cited by examiner

*Primary Examiner*—Son Mai
(74) *Attorney, Agent, or Firm*—Morgan, Lewis & Bockius LLP

(57) ABSTRACT

A column repair circuit and method of a nonvolatile ferroelectric memory device can include: a memory test logic block capable of generating a redundancy active pulse (RAP) and a corresponding fail input/output (IO) number FION<r> if a column address including a fail bit to be repaired is found during test; a power-up sensor capable of generating a power-up pulse if a stable power source voltage is sensed; a first redundancy control block capable of generating first to fifth control signals ENN, ENP, EQN, CPL, and PREC and a sixth control signal ENW in response to the RAP and the power-up pulse; a counter generating n bit counter bit signal increased by one bit through the RAP to correspond to the number of redundancy bits; a redundancy counter decoding control block capable of generating an activated coding signal ENW<n> in response to the counter bit signal of the counter and the sixth control signal ENW; and a redundancy coding block capable of coding a fail column address in response to the coding signal ENW<n>, the first to fifth control signals, the first and second address signals ADD and ADDB, and the fail IO number FION<r>, and coding a fail IO bus.

29 Claims, 13 Drawing Sheets

US 6,597,608 B2

CODING CELL OF NONVOLATILE FERROELECTRIC MEMORY DEVICE AND OPERATING METHOD THEREOF, AND COLUMN REPAIR CIRCUIT OF NONVOLATILE FERROELECTRIC MEMORY DEVICE HAVING THE CODING CELL AND METHOD FOR REPAIRING COLUMN

This application claims the benefit of Korean Application No. 2001-0032475 filed Jun. 11, 2001, which is hereby incorporated by reference.

BACKGROUND OF THE INVENTION

1. Field of the Invention

The present invention relates to a semiconductor memory device, and more particularly, to a column repair circuit and method of a nonvolatile ferroelectric memory device.

2. Discussion of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows a unit cell of a related art nonvolatile ferroelectric memory.

As shown in FIG. 2, the related art nonvolatile ferroelectric memory can include a bitline B/L formed in one direction, a wordline W/L formed to cross the bitline, a plate line P/L spaced apart from the wordline in the same direction as the wordline, a transistor T with a gate connected with the wordline and a source connected with the bitline, and a ferroelectric capacitor FC. A first terminal of the ferroelectric capacitor FC is connected with a drain of the transistor T and a second terminal is connected with the plate line P/L.

A redundancy algorithm of the related art nonvolatile ferroelectric memory device will now be described with reference to FIG. 3.

As shown in FIG. 3, a full address memory test and a fail bit analysis are carried out in such a manner that a chip test is carried out after a prior process to find out a fail address.

When the analyzed fail address can be repaired by a row repair circuit, a fuse is cut using a laser beam to code a corresponding address in a row repair fuse block.

Once the corresponding fail address is input after the fuse cutting is completed, an active signal of the repair circuit is generated to activate a repair cell.

Meanwhile, a main cell corresponding to the fail address is inactivated by an inactive signal of the repair circuit.

Therefore, the main cell of a corresponding fail address is inactivated while the repair cell is activated.

The aforementioned related art method for repairing a fail address of a nonvolatile semiconductor memory device has several problems.

If a fail bit is generated, the analysis step of the fail bit is additionally required. In this case, a problem arises in that the redundancy algorithm becomes complicated. For this reason, there is limitation in reducing the redundancy time.

Furthermore, since the fuse is cut using the laser beam to repair the failed cell, it is difficult to change or add the redundancy algorithm at any time.

SUMMARY OF THE INVENTION

Accordingly, the present invention is directed to a column repair circuit and method of a nonvolatile ferroelectric memory device that substantially obviates one or more of problems due to limitations and disadvantages of the related art.

The present invention provides a column repair circuit and method of a nonvolatile ferroelectric memory device, in which a redundancy cell having a ferroelectric capacitor is provided without a separate fail bit analysis and fuse cutting, to change or add a redundancy algorithm at any time.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in a column repair circuit of a nonvolatile ferroelectric memory device having a repair logic unit therein, the column repair circuit can include: a memory test logic block generating a redundancy active pulse (RAP) and a corresponding fail input/output (IO) number FION<r> if a column address including a fail bit to be repaired is found during test; a power-up sensor generating a power-up pulse if a stable power source voltage is sensed; a first redundancy control block generating first to fifth control signals ENN, ENP, EQN, CPL, and PREC and a sixth control signal ENW in response to the RAP and the power-up pulse; a counter generating n bit counter bit signal increased by one bit through the RAP to correspond to the number of redundancy bits; a redundancy counter decoding control block generating an activated coding signal ENW<n> in response to the counter bit signal of the counter and the sixth control signal ENW; and a redundancy coding block coding a fail column address in response to the coding signal ENW<n>, the first to fifth control signals, the first and second address signals ADD and ADDB, and the fail IO number FION<r>, and coding a fail IO bus.

In another aspect of the present invention, a column repair method of a nonvolatile ferroelectric memory device having a repair logic unit therein, the column repair method can include the steps of: generating a redundancy active pulse (RAP) and a corresponding fail input/output (IO) number FION<r> in a memory test logic block if a column address including a fail bit to be repaired is found during test; generating a power-up pulse in a power-up sensor if a stable power source voltage is sensed; generating first to fifth control signals ENN, ENP, EQN, CPL, and PREC and a sixth control signal ENW in response to the RAP and the power-up pulse; generating n bit counter bit signal in a counter, the n bit counter bit signal being increased by one bit through the RAP to correspond to the number of redundancy bits; generating an activated coding signal ENW<n> in response to the counter bit signal of the counter and the sixth control signal ENW; and coding a fail column address in a redundancy coding block that received the coding signal ENW<n>, the first to fifth control signals, the first and second address signals ADD and ADDB, and the fail IO number FION<r>, and coding a fail IO bus.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

A column repair circuit of a nonvolatile ferroelectric memory device according to the present invention will be described with reference to FIG. 4.

Figure 1:
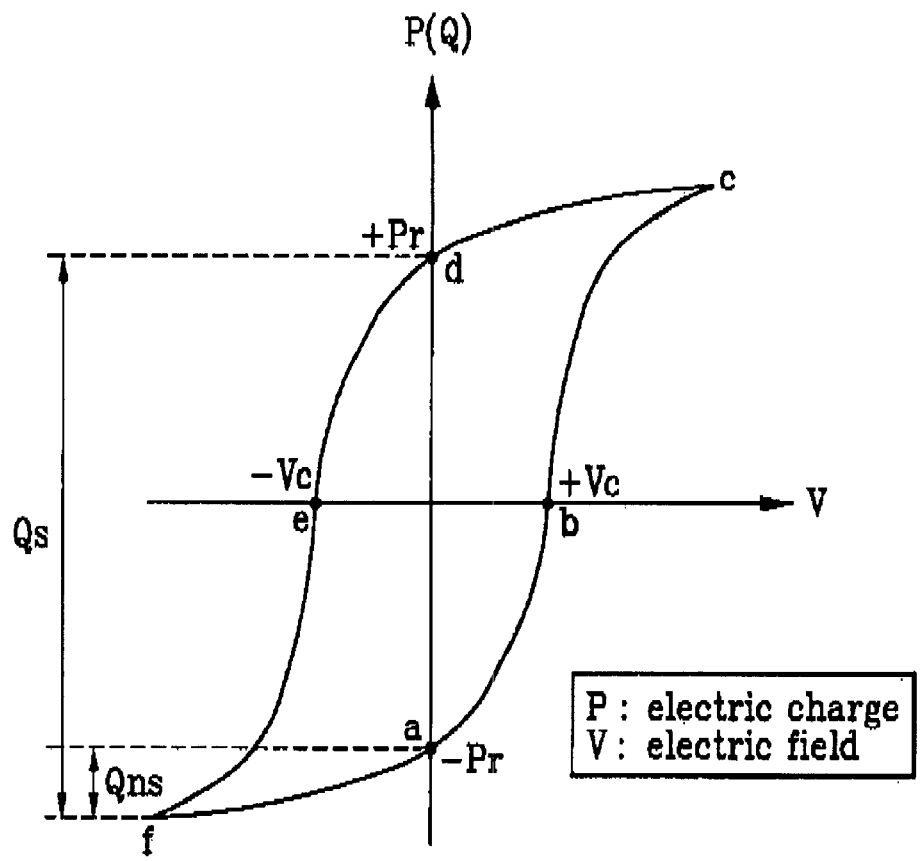
FIG. 1 shows a hysteresis loop of a general ferroelectric.
Figure 2:
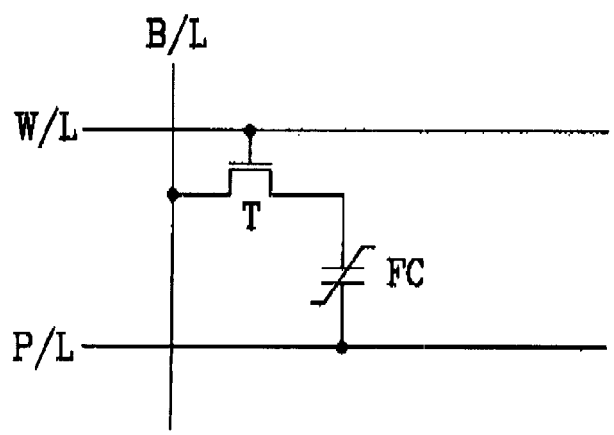
FIG. 2 is a schematic view of a unit cell of a related art nonvolatile ferroelectric memory device.
Figure 3:
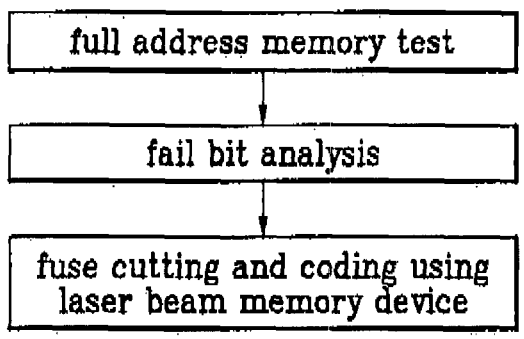
FIG. 3 is a block diagram illustrating a redundancy algorithm of the related art nonvolatile ferroelectric memory device.
Figure 4:
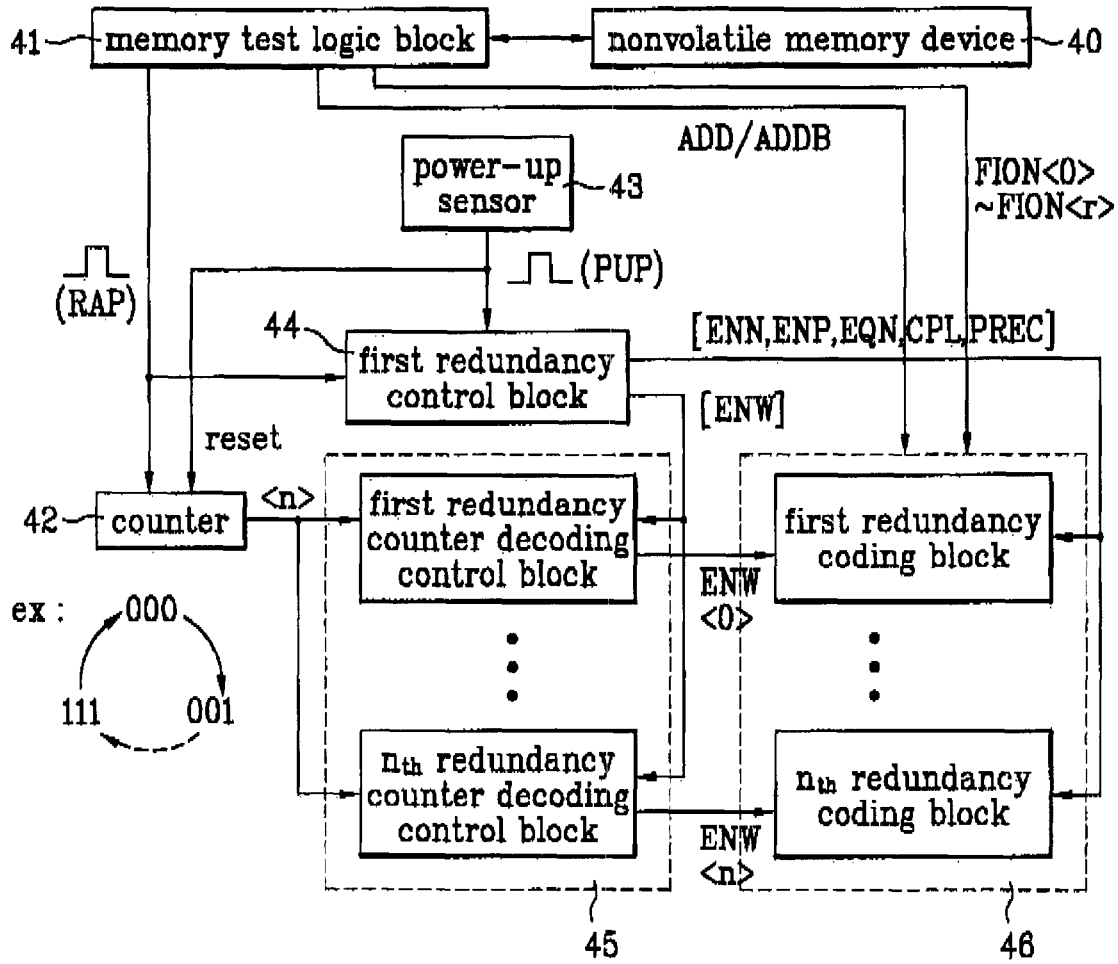
FIG. 4 is a block diagram illustrating a column repair circuit of a nonvolatile ferroelectric memory device according to the present invention.

As shown in FIG. 4, the column repair circuit can include a nonvolatile memory device 40, a memory test logic block 41, a counter 42, a power-up sensor 43, a first redundancy control block 44, a redundancy counter decoding control block 45, and a redundancy coding block 46.

The nonvolatile memory device 40 preferably includes FRAM. The memory test logic block 41 tests the nonvolatile memory device 40. The nonvolatile memory device 40 and the memory test logic block 41 can transmit and receive data input/output signals to and from each other.

A built-in self test logic circuit is separately provided in an embedded system chip to enable memory test therein.

The memory test logic block 41 generates a redundancy active pulse (RAP) if an address containing a fail bit is found in the nonvolatile memory device 40 during test.

The RAP is not generated if a fail bit is additionally found in a row address other than the above row address where the RAP is generated.

Therefore, a plurality of fail bits generated in an arbitrary column can be repaired by a column redundancy circuit.

Furthermore, the memory test logic block 41 outputs a fail IO number pulse <r>(FION<0>~FION<r>) to choose a corresponding one of a plurality of IOs processed in parallel.

Figure 14:
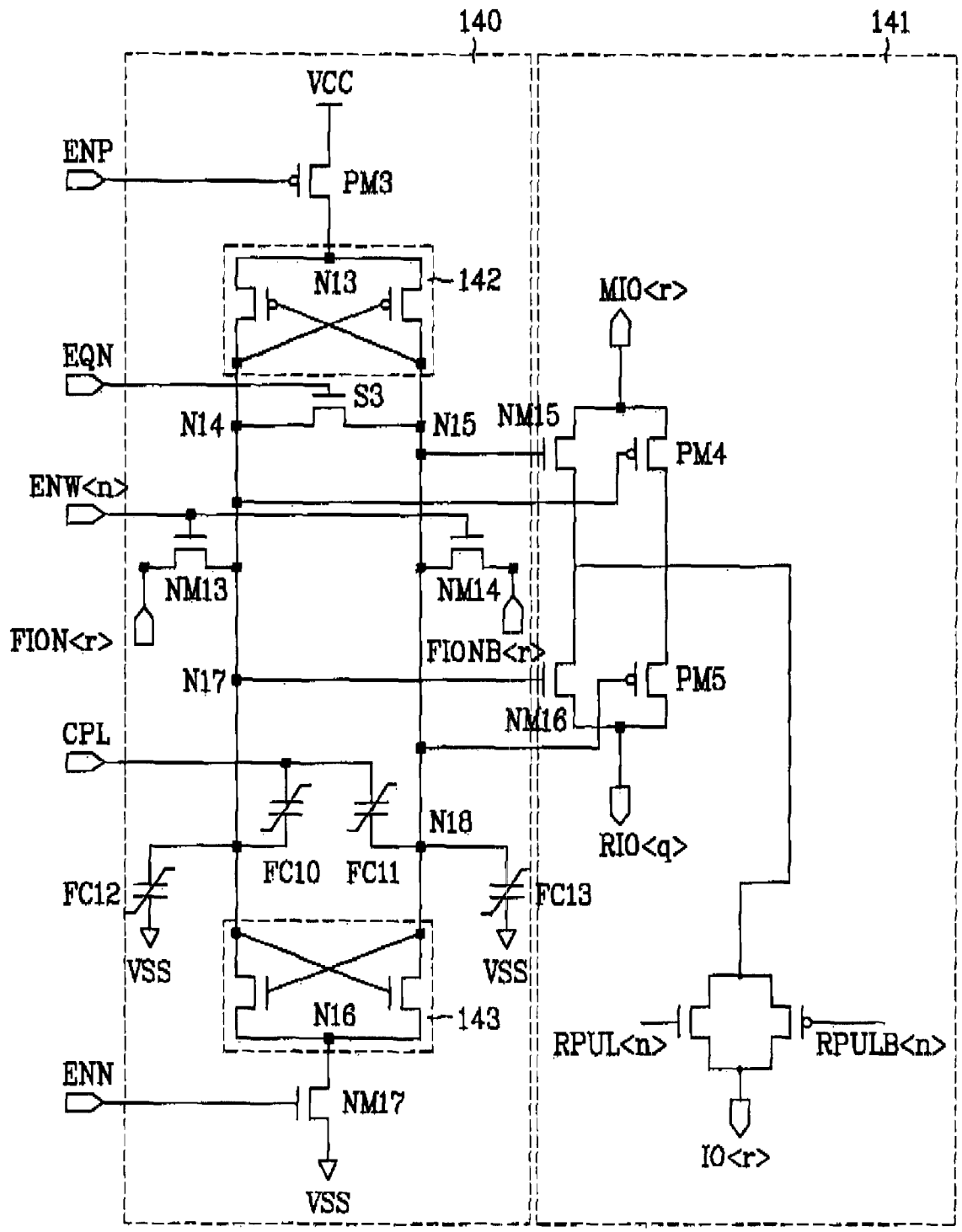
FIG. 14 is a circuit diagram illustrating a redundancy IO coding cell according to the present invention.

The FION pulse is stored in a redundancy IO coding cell of FIG. 14. If a corresponding fail IO is input, it can be repaired using a redundancy column.

If a fail bit is found in two or more IOs, the memory test logic block 41 chooses one of them to output a high pulse FION<r>.

In other words, one IO is repaired at one time, and the other IOs are tested again. Thus, when the fail bit is generated, it is repaired using another redundancy coding block.

Even if a plurality of IO fails are generated in the same column address, they can be repaired.

The power-up sensor 43 generates a power-up pulse (PUP) if a power source voltage is input thereto.

The counter 42 is designed to generate n bit counter bit from the RAP relative to the number of redundancy bits.

In other words, if the number of redundancy bits is four, the counter 42 outputs 2 bits. If the number of redundancy bits is eight, the counter 42 outputs 3 bits. If the number of redundancy bits is sixteen, the counter 42 outputs 4 bits.

For example, if the counter 42 is designed to output 3 bits with 8 redundancy bits, as shown in FIG. 4, bits "000" are increased to "111" and again back to "000". Such a cycle is repeated.

Since a trigger pulse of the counter 42 is the RAP, the RAP is generated if a fail bit is generated. In this case, the counter 42 has an increased bit by one bit by the RAP. The counter 42 is reset in response to the PUP signal of the power-up sensor 43.

For example, if an initial state of the counter 42 is "111", the counter 42 outputs "000" by one RAP. Only RCDC<0> from the redundancy counter decoding control (RCDC) block 45 is activated by the code "000" while the other RCDC<n> is inactivated.

The first redundancy control block 44 outputs redundancy control signals ENN, ENP, EQN, CPL, PREC, and ENW in response to the PUP of the power-up sensor 53 and the RAP of the memory test logic block 41. These redundancy control signals serve to read a redundancy coding state from the redundancy counter decoding control block 45.

The control signal, ENW, involved in a fail address coding program and fail IO coding controls the redundancy counter decoding control block 45.

In other words, an activated ENW<n> is output by the activated ENW input to the activated redundancy counter decoding control block 45.

The activated ENW<n> is to program the fail address and the fail IO in a redundancy coding cell and a redundancy IO coding cell of the redundancy coding block 46. Thus, the redundancy cell is activated if the programmed fail address and fail IO are input.

Next, the redundancy counter decoding control block 45 can include a plurality of first redundancy counter decoding control block RCDC<0> to nth redundancy counter decoding control block RCDC<n>. The redundancy counter decoding control block 45 outputs the ENW<n> to the redundancy coding block 46, i.e., the redundancy coding block diagram (RCBD) in response to the counter bit signal output from the counter 42 and the redundancy control signal ENW output from the first redundancy control block 44.

The redundancy coding block (RCBD) 46 can include a plurality of first to nth redundancy coders.

The redundancy coding block 46 reads a redundancy coding state in response to first and second address signals ADD and ADDB, fail IO numbers FION<0>~FION<r>, the ENW<n>, ENN, ENP, EQN, CPL, and PREC. Also, the redundancy coding block 46 programs the fail address and the fail IO in a redundancy coding cell and a redundancy IO coding cell of a corresponding coding block. If a corresponding fail address and fail IO are input, a redundancy cell is used to repair them.

Figure 5:
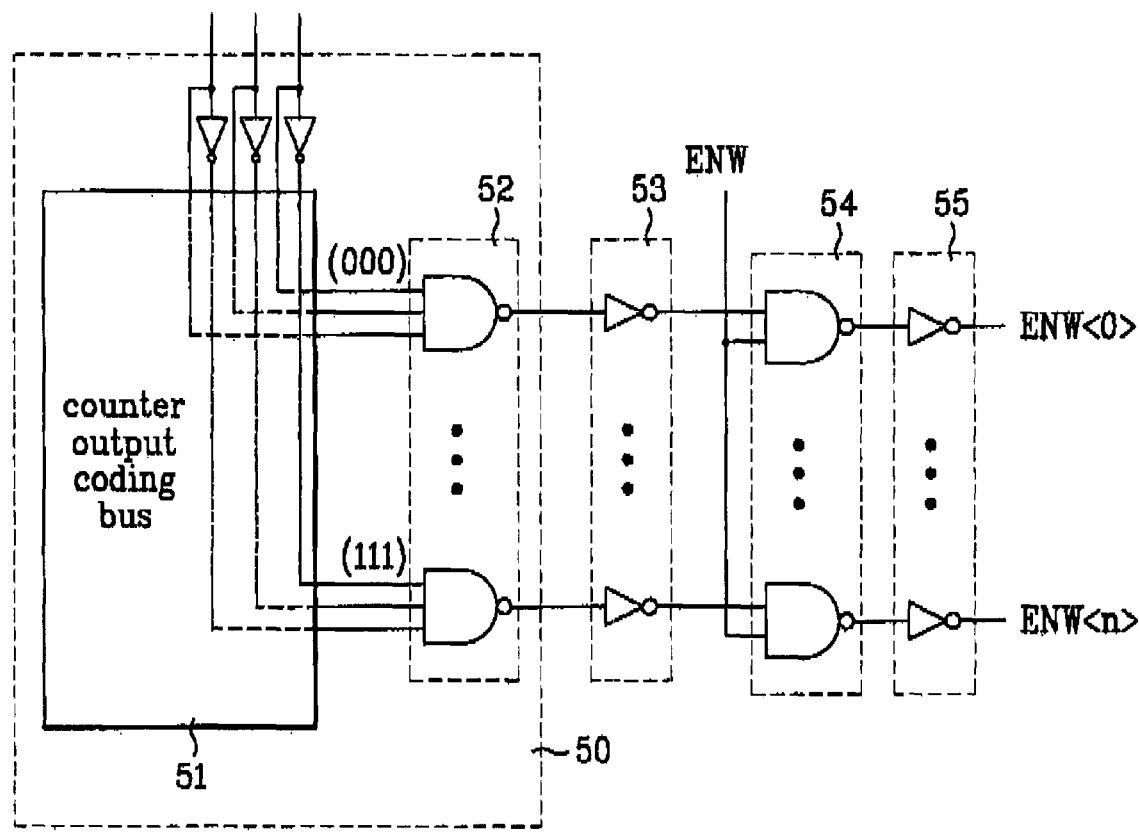
FIG. 5 is block diagram illustrating a redundancy counter decoding control (RCDC) block of FIG. 4.

The redundancy counter decoding control block 45 will now be described in more detail with reference to FIG. 5.

The counter output decoder 50 for outputting a counter bit signal from the counter 42 will first be described.

The counter output decoder 50 can include a counter output coding bus 51 for coding the counter bit signal output from the counter 42, and a first NAND gate block 52 including a plurality of NAND gates performing logic AND operation of each coding signal from the counter output coding bus 51 and inverting the resultant value.

The redundancy counter decoding control block 45 can include a first inverter block 53 including a plurality of inverters inverting an output signal of each NAND gate of the first NAND gate block 52, a second NAND gate block 54 including a plurality of NAND gates performing logic AND operation of an output signal of each inverter of the first inverter block 53 and inverting the resultant value, and a second inverter block 55 including a plurality of inverters inverting an output signal of each NAND gate of the second NAND gate block 54 and outputting signals ENW<0>~ENW<n>.

The redundancy counter decoding control block 45 codes one redundancy block by activating only one redundancy control signal ENW<n> when a counter code is changed one time. Thus, only one redundancy coding block is activated.

A circuit of an FRAM chip region according to the present invention will be described below.

Figure 6:
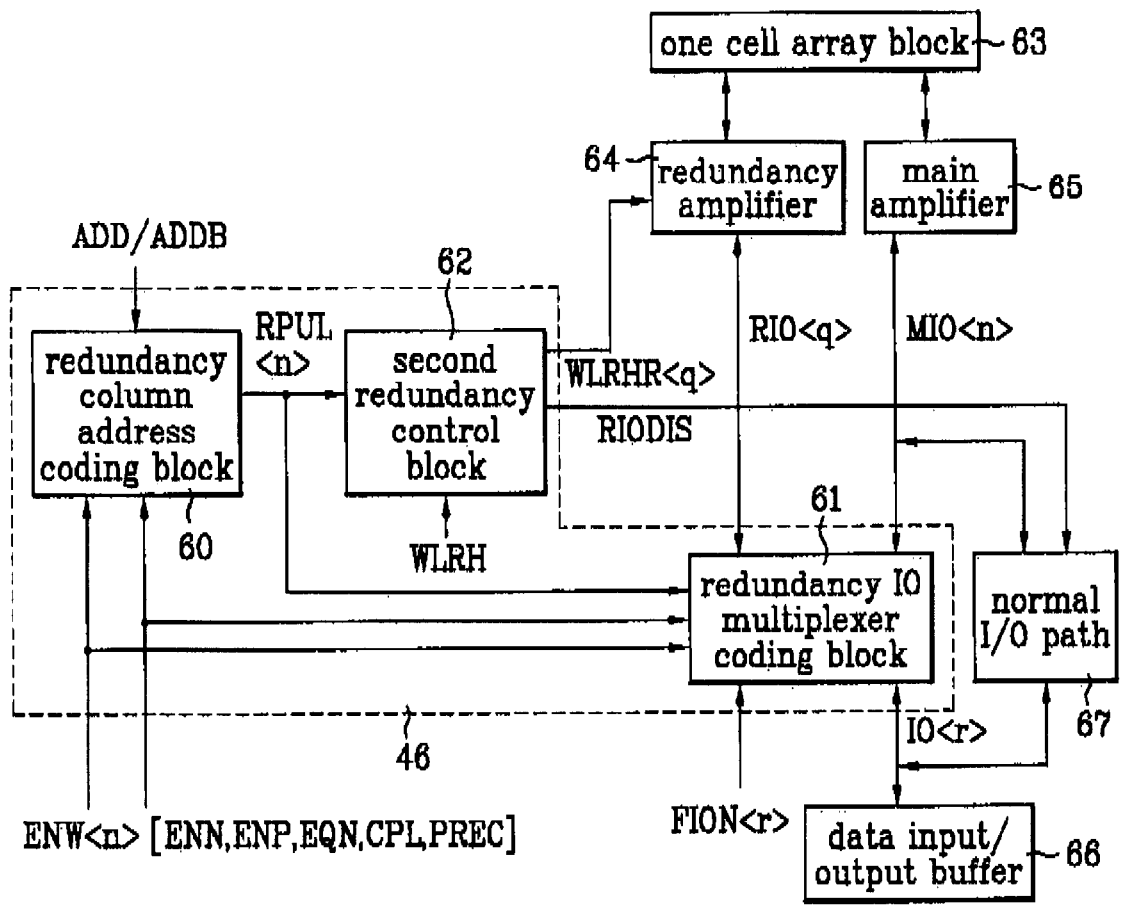
FIG. 6 is a block diagram illustrating a redundancy coding (RCBD) block and its peripheral circuits according to the present invention.

FIG. 6 is a block diagram illustrating the redundancy coding block and its peripheral circuits according to the present invention.

As shown in FIG. 6, the redundancy coding block 46 can include a redundancy column address coding block 60, a redundancy IO multiplexer coding block 61, and a second redundancy control block 62.

Peripheral circuits of the redundancy coding block 46 can include one cell array block 63, a redundancy amplifier 64, a main amplifier 65, a data input/output buffer 66, and a normal IO path 67.

The redundancy coding block 46 stores a column address of a current cycle in a redundancy cell. If a RAP is generated as the current column address is tested by the memory test logic block 41, it will include a fail bit, and the redundancy coding block 46 stores the current column address in the redundancy cell.

The redundancy column address coding block 60 of the present invention will be described with reference to FIG. 6.

As shown in FIGS. 4 and 6, the redundancy column address coding block 60 is operated in response to the signals ENN, ENP, EQN, CPL, and PREC output from the first redundancy control block 44, the signal ENW<n> output from the redundancy counter decoding control block 45, and the first and second address signals ADD/ADDB output from the memory test logic circuit 41. The redundancy column address coding block 60 also outputs RPUL<n> of n bit to the redundancy IO multiplexer coding block 61 in response to the above signals.

The redundancy IO multiplexer coding block 61 repairs a corresponding fail IO in response to the RPUL<n>, FION<r>, ENN, ENP, EQN, CPL, PREC, and ENW<n>.

The second redundancy control block 62 outputs a signal WLPHR<q> and a signal RIODIS in response to RPUL<n> and a signal WLRH that can control a read/write mode of a data bus. The WLRHR is used to control the redundancy amplifier 64 during redundancy operation. That is to say, when a redundancy path is used in an address containing a corresponding fail bit, the read/write mode is normally operated.

However, when the address does not contain a corresponding fail bit, the write mode is inactivated so that error data is prevented from being written in the redundancy cell.

Figure 7:
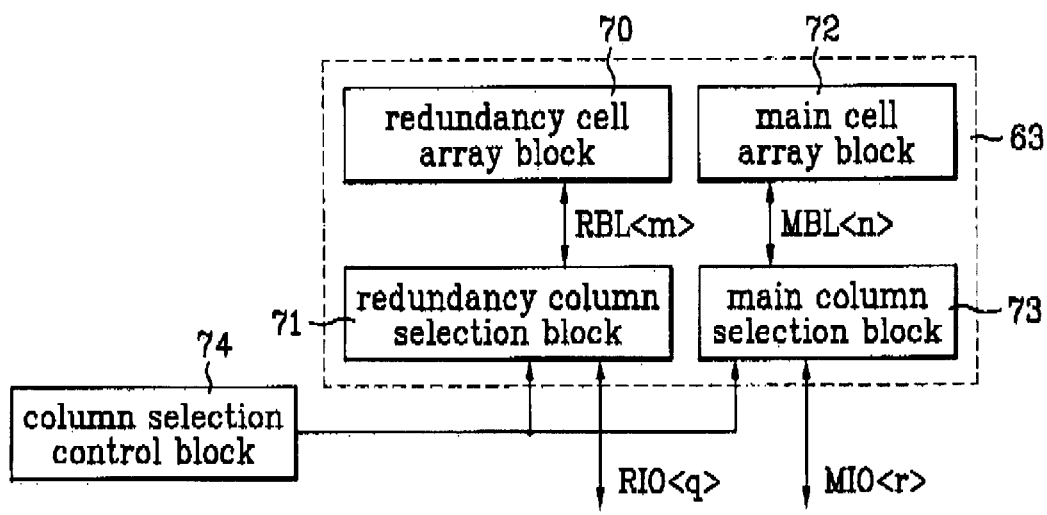
FIG. 7 is a block diagram illustrating a core cell array block that prevents error data from being written in a redundancy cell.

FIG. 7 is a block diagram illustrating a core cell array block that prevents error data from being written in the redundancy cell.

The core cell array block can include a redundancy cell array block 70, a redundancy column selection block 71, a main cell array block 72, and a main column selection block 73. A column selection control block 74 can be provided in the vicinity of the core cell array block.

The redundancy column selection block 71 is activated when all the column bit lines are activated.

In this case, redundancy cell data is not changed in a read mode while it may be changed in a write mode. Therefore, the redundancy amplifier is operated in a read mode in an inactivated redundancy column address.

The redundancy amplifier 64 is operated in response to the signal WLRHR<q> while the main amplifier 65 is operated in response to the signal WLRH in normal state.

The WLRH is high in a read mode while it is low in a write mode. The WLRHR is normally operated in a corresponding fail column address. That is, the WLRHR is high in a read mode while it is low in a write mode.

However, once the normal column address is input, the WLRHR becomes high in both the read and write modes, so that it is operated in only a read mode, thereby protecting the redundancy cell data.

Next, detailed circuit structures of the redundancy column address coding block 60, the redundancy IO multiplexer coding block 61, and the second redundancy control block 62, and their operation will be described.

The redundancy column address coding block 60 can include a redundancy master cell 80 and a plurality of redundancy coding cells. See FIG. 8. The redundancy column address coding block 60 further includes a first NOR gate NOR1 performing logic OR operation of an output signal according to on/off state of the redundancy coding cells and inverting the resultant value, a first inverter IN1 inverting a signal of the first NOR gate NOR1, a second inverter IN2 inverting a signal of the first inverter IN1 and outputting a signal RPUL<n>, and PMOS transistors respectively arranged in final output terminals of the redundancy coding cells connected in a row direction to transmit a master signal.

Each of the PMOS transistors can be arranged in such a manner that a ground voltage VSS is arranged between each final output terminal of the redundancy coding cells and a power source voltage terminal VCC.

At this time, the master signal is input to one input terminal of the first NOR gate NOR1 depending on a connection state between RS1 and RS2 following the operation of four redundancy coding cells.

The first redundancy coding cell is connected with the second redundancy coding cell through RS1. The second redundancy coding cell is connected with the third redundancy coding cell through RS2. The third redundancy coding cell is connected with the fourth redundancy coding cell through RS1.

The redundancy master cell 80 can activate or inactivate the whole redundancy coding cells.

The redundancy master cell 80 and the redundancy coding cells can be operated in response to the signals ENN, ENP, EQN, CPL, and PREC output from the first redundancy control block 44 and the signal ENW<n> output from the redundancy counter decoding control block 45.

When the redundancy master cell 80 is inactivated (default state), it outputs a master signal of high level. When the redundancy master cell 80 is activated, it outputs a master signal of low level.

The redundancy coding cells can store an actual fail column address.

In a state where the fail column address is stored in the redundancy coding cells, if a fail column address equal to the stored fail column address is input, RS1 and RS2 are connected with each other, i.e., no resistance occurs, thereby flowing current thereto. Conversely, if the fail column address not equal to the stored fail column address is input, RS1 and RS2 are not connected with each other, i.e., high resistance occurs.

RPUL<n> can be output at high level only when all the redundancy coding cells are turned on. The RPUL<n> is output at low level in the other cases.

The signal RPUL<n> of high level is used to activate WLRHR<q> and RIODIS through the second redundancy control block 62.

The signal WLRPHR<q> is to normally operate the read and write modes when the redundancy path is used in a corresponding fail bit address.

When the redundancy path is used, the signal RIODIS is maintained at low level to inactivate a transmission gate. The signal RIODIS is maintained at high level to activate the transmission gate during normal column operation.

The second redundancy column control block 62 will be described with reference to FIG. 9.

Figure 9:
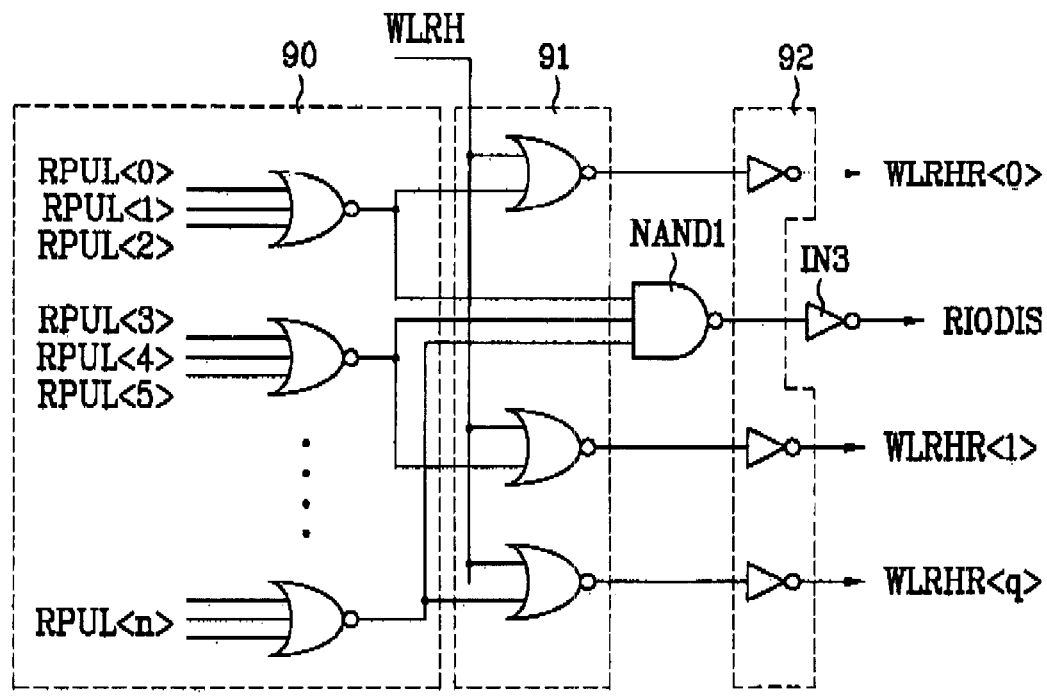
FIG. 9 is a circuit diagram illustrating a second redundancy control block of FIG. 6.

As shown in FIG. 9, the second redundancy column control block 62 can include a first NOR gate block 90 including a plurality of third input NOR gates, a second NOR gate block 91 including second input NOR gates corresponding to the NOR gates of the first NOR gate block 90 in an one-to-one ratio, performing logic OR operation of an output signal of each nor gate and the signal WLRH, and inverting the resultant value, an inverter block including inverters corresponding to the NOR gates of the second NOR gate block 91 in an one-to-one ratio and inverting their output signals, a first NAND gate NAND1 performing logic AND operation each output signal of the NOR gates of the first NOR gate block 90 and inverting the resultant value, and a third inverter IN3 inverting a signal of the first NAND gate NAND1.

The signals RPUL<n> input to the second redundancy control block 62 serve to control respective IOs so that they are respectively connected with a corresponding redundancy amplifier when a plurality of IOs are repaired in one cell array region or one column address.

In other words, as shown in FIG. 9, one fail IO is assigned using RPUL<0>, RPUL<1>, and RPUL<2> as one group while another fail IO is assigned using RPUL<3>, RPUL<4>, and RPUL<5> as one group.

On the other hand, the signals RPUL<n> input to the second redundancy control block 62 serve to control the respective IOs so that they are connected with one redundancy amplifier when one IO is repaired in different cell array regions or one column address.

The redundancy IO multiplexer 61 will now be described with reference to FIG. 10.

Figure 10:
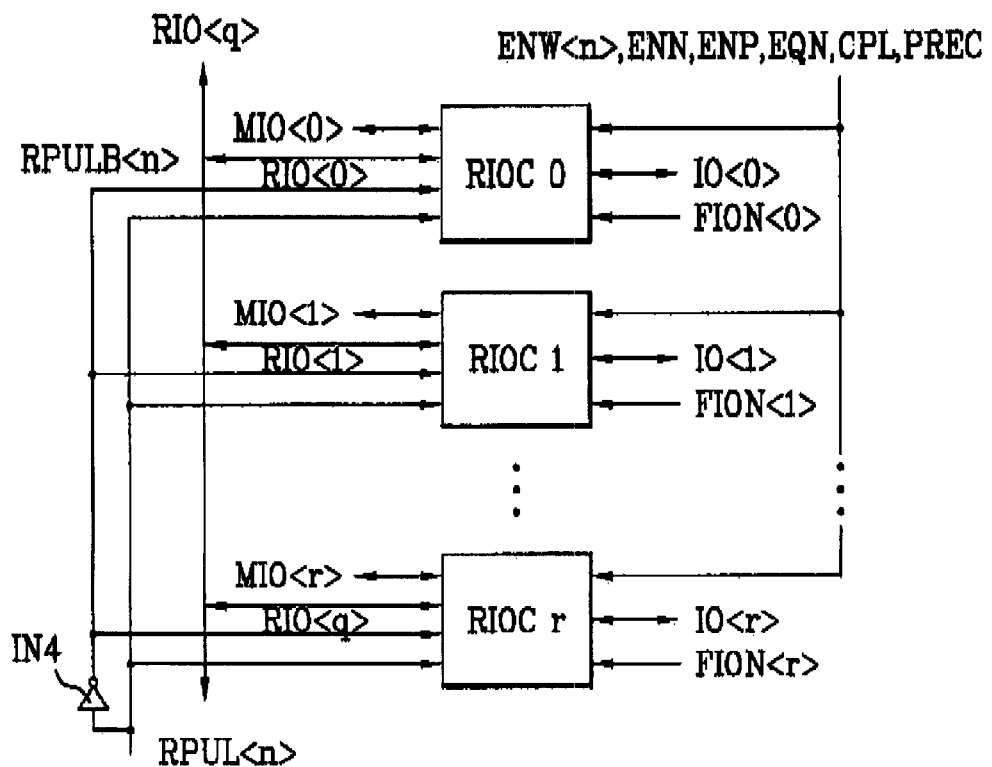
FIG. 10 is a circuit diagram illustrating a redundancy IO multiplexer.

As shown in FIGS. 6 and 10, the redundancy IO multiplexer 61 can include a fourth inverter IN4 receiving ENW<n>, ENN, ENP, EQN, CPL, PREC, RPUL<n>, and FION<r>, connecting a bus IO<r> to a bus MIO<r> or RIO<q>, inverting a plurality of redundancy IO coding cells RIOC0~RIOCr and RPUL<n>, and outputting RPULB<n>.

At this time, MIO<r> is a main data bus having the number of normal IO bus widths by 'r'. RIO<q> is a redundancy data bus having the number of redundancy IO bus widths by 'q'. IO<r> is a data input/output buffer width and is equal to MIO<r> width.

The redundancy IO multiplexer coding block 61 is a basic IO multiplexer in which one RIO is used as a redundancy IO among 'q' number of RIOs. That is, one of 'r' number of MIO<r> is replaced with RIO<q> and connected with IO<r>.

In a state that a corresponding fail column address is input, if the RPUL is high level, MIO<r> is connected with IO<r> or RIO<q> is connected with IO<r> depending on the state of each redundancy IO coding cell.

The aforementioned redundancy IO multiplexer coding block 61 is normally operated when a corresponding fail column address is input. By contrast, the redundancy IO multiplxer coding block 61 is inactivated when a normal column address is input. In other words, when a normal column address is input, RPUL<n> becomes low level and RIO<q> and MIO<r> are disconnected from IO<r>.

When the normal column address is input, the normal IO path 67 operated in a normal mode will be described below.

Figure 11A:
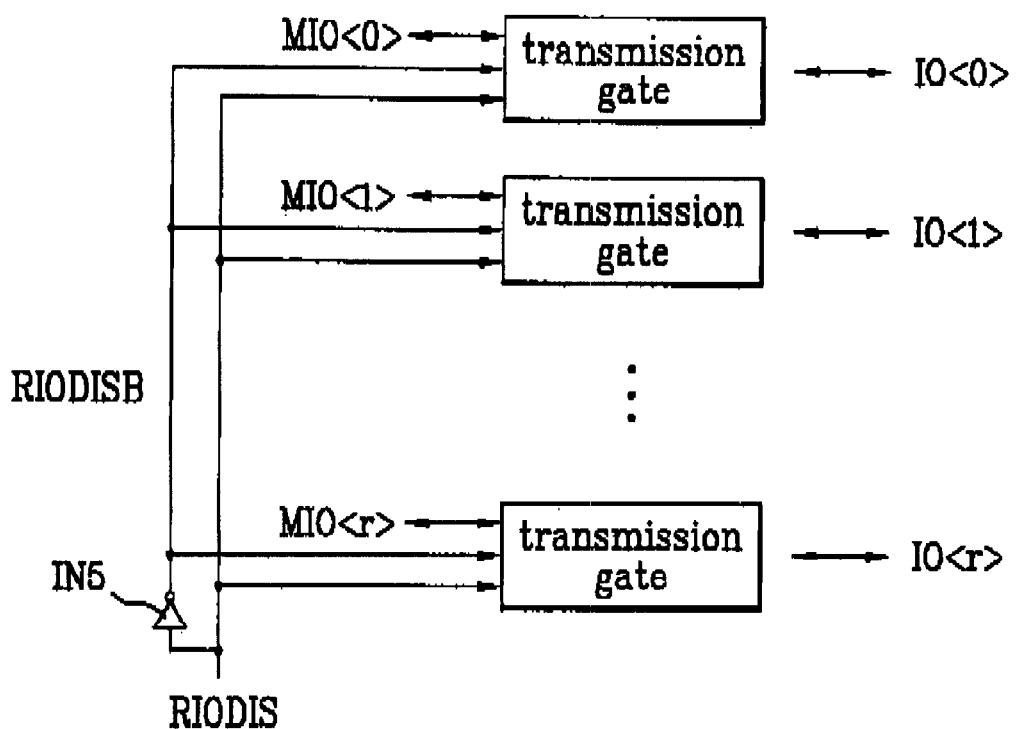
FIG. 11A is a circuit diagram illustrating a normal IO path in a normal mode.
Figure 11B:
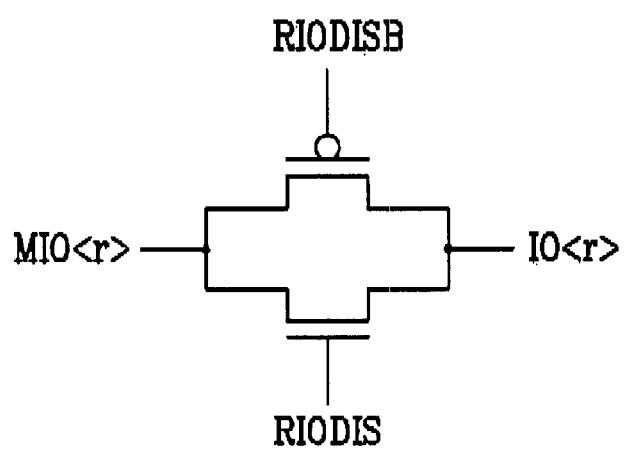
FIG. 11B is a circuit diagram illustrating a transmission gate of FIG. 11A.

As shown in FIGS. 11A and 11B, the normal IO path 67 can include a plurality of transmission gates that determine whether to connect the bus MIO<r> with the bus IO<r> in response to the signals RIODIS and RIODISB, and a fifth inverter IN5 inverting the signal RIODIS and outputting the signal RIODISB.

Each of the transmission gates can include an NMOS transistor receiving the signal RIODIS and a PMOS transistor receiving the inverted signal RIODISB of the signal RIODIS. Each source terminal of them is in contact with each drain terminal of them. The source and drain terminals are respectively connected with the buses IO<r> and MIO<r>.

The signal RIODIS is maintained at low level during redundancy operation to inactivate the transmission gates. On the other hand, the signal RIODIS is maintained at high level in a normal column operation to activate the transmission gates, thereby connecting the bus MIO<r> with the bus IO<r>.

The circuit structure of the unit redundancy coding cell constituting the redundancy column address coding block 60 of FIG. 6 and the unit redundancy IO coding cell RIOC constituting the redundancy coding cell 80 and the redundancy IO multiplexer coding block 61 will be described below.

Figure 8:
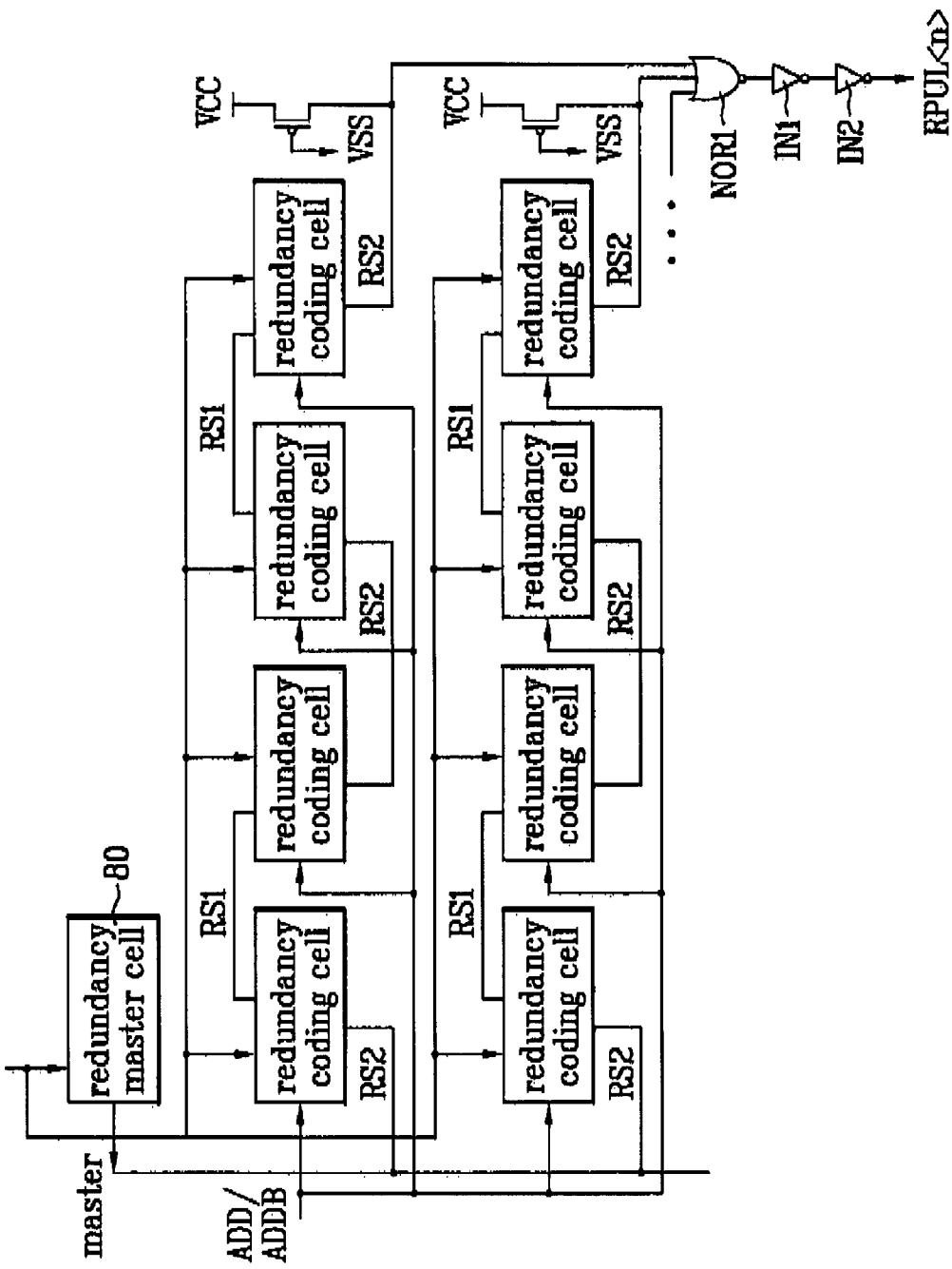
FIG. 8 is a block diagram illustrating a redundancy column address coding block according to the present invention.
Figure 12:
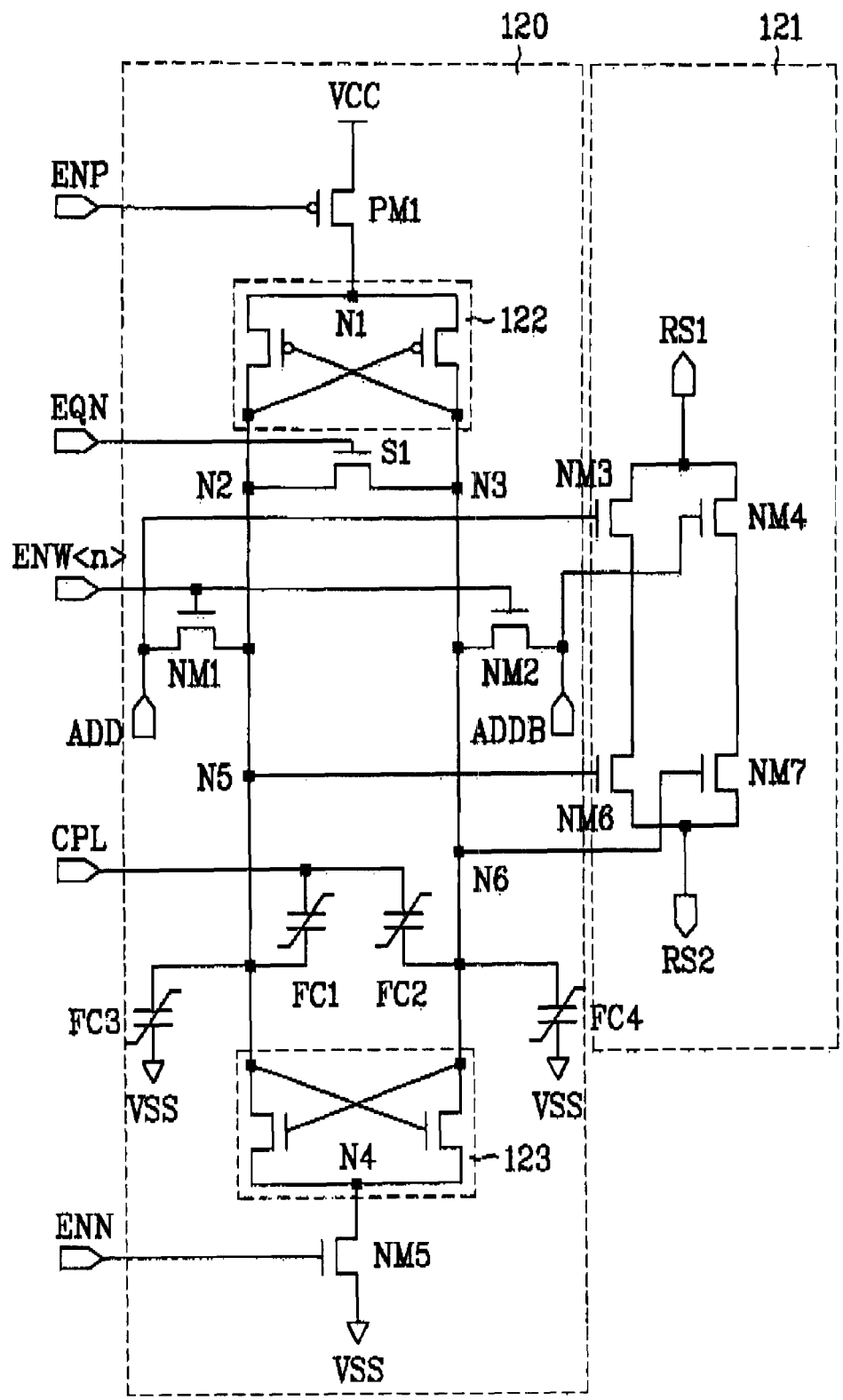
FIG. 12 is a circuit diagram illustrating a redundancy coding cell of FIG. 8.

FIG. 12 is a circuit diagram illustrating a redundancy coding cell of FIG. 8.

As shown in FIG. 12, the redundancy coding cell can include a fail address data register 120 and a fail address switching block 121, and determines whether to connect RS1 to RS2 in response to the signals ENN, ENP, EQN, CPL, ENW, ADD, and ADDB.

The fail address data register 120 can include a first PMOS transistor PM1 transferring a power source voltage VCC to a first node N1 in response to the signal ENP; a first latch 122 having one node connected with the first node N1 and the other node connected with second and third nodes N2 and N3; a first NMOS switch S1 controlling whether to connect the second node N2 with the third node N3 in response to the signal EQN; a first NMOS transistor NM1 having a gate terminal to which the signal ENW<n> is input, a source terminal to which a signal of the second node N2 is transferred, and a drain terminal to which the first address signal ADD is input; a second NMOS transistor NM2 having a gate terminal to which the signal ENW<n> is input, a source terminal to which a signal of the third node N3 is transferred, and a drain terminal to which the second address signal ADDB is input; a fifth NMOS transistor NM5 transferring the ground voltage VSS to a fourth node N4 in response to the signal ENN; a second latch 123 having one node connected with the fourth node N4 and the other node connected with fifth and sixth nodes N5 and N6; a first ferroelectric capacitor FC1 arranged between an input terminal of the signal CPL and the fifth node N5; a second ferroelectric capacitor FC2 arranged between the input terminal of the signal CPL and the sixth node N6; a third ferroelectric capacitor FC3 arranged between the fifth node N5 and the ground voltage terminal VSS; and a fourth ferroelectric capacitor FC4 arranged between the sixth node N6 and the ground voltage terminal VSS.

The fail address switching block 121 can include third and fourth NMOS transistors NM3 and NM4 turned on/off depending on the first and second address signals ADD and ADDB, and sixth and seventh NMOS transistors NM6 and NM7 turned on/off under the control of the signals of the fifth and sixth nodes N5 and N6.

If either the third and sixth NMOS transistors NM3 and NM6 or the fourth and seventh NMOS transistors NM4 and NM7 are turned on, RS1 is connected with RS2.

The first latch 122 can include two PMOS transistors while the second latch 123 can include two NMOS transistors.

Data stored in the first and second ferroelectric capacitors FC1 and FC2 are opposite to each other. The third and fourth ferroelectric capacitors FC3 and FC4 serve as capacitance loading elements required to sense and read the stored data.

The RS1 and RS2 are output nodes that determine which fail address is stored in the redundancy coding cell.

For example, if the fail address is high, the ADD is high while the ADDB is low.

If the first and second NMOS transistors NM1 and NM2 are turned on by the signal ENW<n>, high data and low data are respectively stored in the first and second ferroelectric capacitors FC1 and FC2.

At this time, if a corresponding fail address is input after redundancy coding, the fifth node N5 and the ADD become high level, so that the third and sixth NMOS transistors NM3 and NM6 are turned on. Thus, the RS1 and RS2 are under low resistance state in which they are electrically connected with each other.

By contrast, if an address other than the corresponding fail address is input, the fifth node N5 is maintained at high level while the ADD is maintained at low level, so that the third NMOS transistor NM3 is turned off while the sixth NMOS transistor NM6 is turned on. Thus, the RS1 and RS2 are under high resistance state in which they are not electrically connected with each other.

If the fail address is low, the ADD becomes low and the ADDB becomes high.

If the ENW<n> activated at high level is input, the first and second NMOS transistors NM1 and NM2 are turned on so that low data and high data are respectively stored in the first and second ferroelectric capacitors FC1 and FC2.

If a corresponding fail address is input after redundancy coding, the sixth node N6 and the ADDB become high level, so that the fourth and seventh NMOS transistors NM4 and NM7 are turned on. Thus, the RS1 and the RS2 are under low resistance state in which they are electrically connected with each other.

By contrast, if an address other than the corresponding fail address is input, the sixth node N6 is maintained at high level while the ADDB is maintained at low level, so that the fourth NMOS transistor NM4 is turned off while the seventh NMOS transistor NM7 is turned on. Thus, the RS1 and RS2 are under high resistance state in which they are not electrically connected with each other.

Therefore, the corresponding fail address can be coded.

The structure of the redundancy master cell will be described with reference to FIG. 13.

Figure 13:
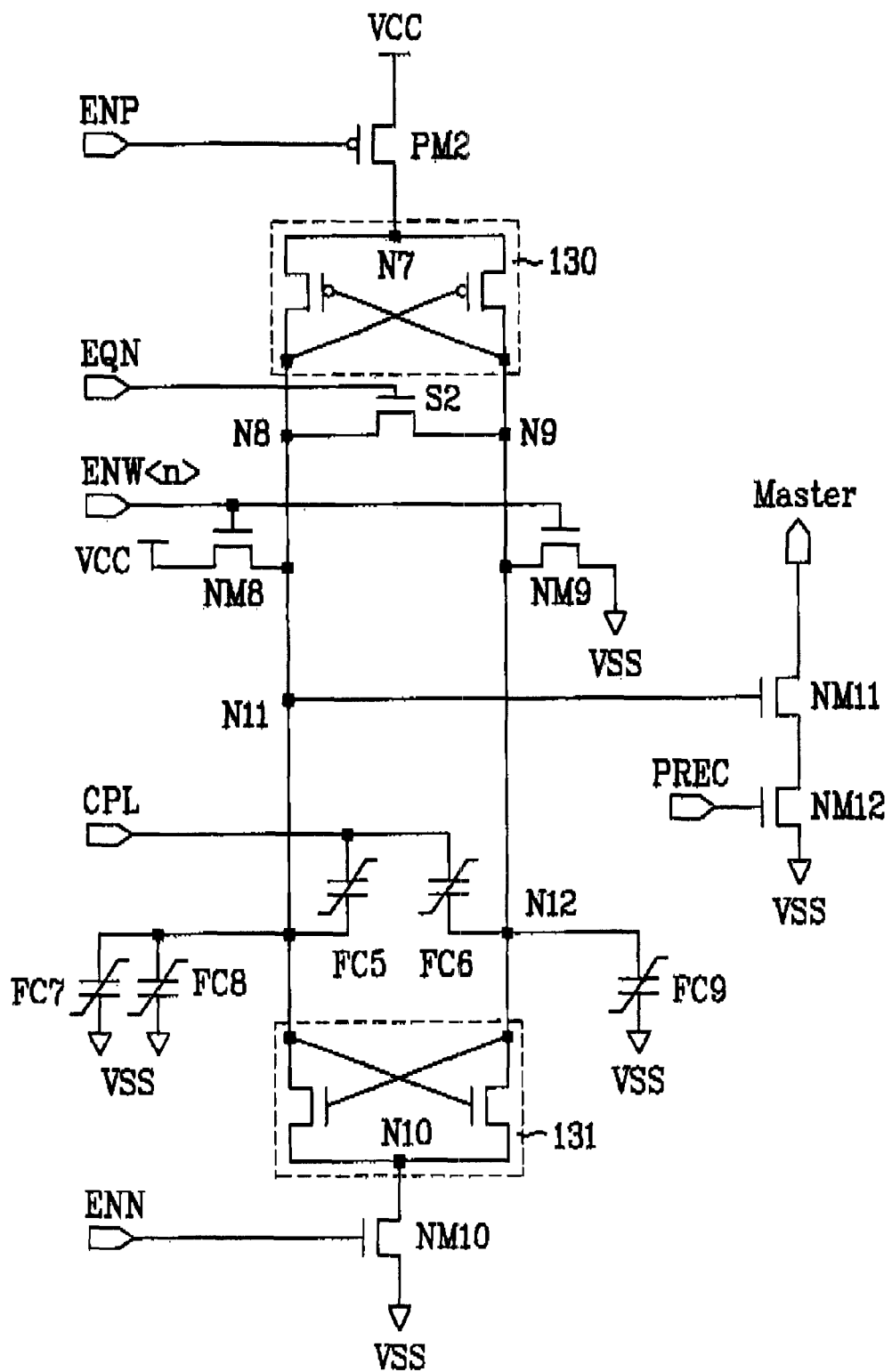
FIG. 13 is a circuit diagram illustrating a redundancy master cell of FIG. 8.

As shown in FIG. 13, the redundancy master cell determines whether to output a master signal in response to the signals ENN, ENP, EQN, CPL, PREC, and ENW.

The redundancy master cell can include a second PMOS transistor PM2 transferring the power source voltage VCC to a seventh node N7 in response to the signal ENP; a third latch 130 having one node connected with the seventh node N7 and the other node connected with eighth and ninth nodes N8 and N9; a second NMOS switch S2 controlling whether to connect the eighth node N8 with the ninth node N9 in response to the signal EQN; an eighth NMOS transistor NM8 having a gate terminal to which the signal ENW<n> is input, a source terminal to which a signal of the eighth node N8 is transferred, and a drain terminal to which the power source voltage is input; a ninth NMOS transistor NM9 having a gate terminal to which the signal ENW<n> is input, a source terminal to which a signal of the ninth node N9 is transferred, and a drain terminal to which the ground voltage VSS is input; a tenth NMOS transistor NM10 transferring the ground voltage VSS to a tenth node N10 in response to the signal ENN; a fourth latch 131 having one node connected with the tenth node N10 and the other node connected with eleventh and twelfth nodes N11 and N12; a fifth ferroelectric capacitor FC5 arranged between the input terminal of the signal CPL and the eleventh node N11; a sixth ferroelectric capacitor FC6 arranged between the input terminal of the signal CPL and the twelfth node N12; seventh and eighth ferroelectric capacitors FC7 and FC8 arranged in parallel between the eleventh node N11 and the ground voltage terminal VSS; a ninth ferroelectric capacitor FC9 arranged between the twelfth node N12 and the ground voltage terminal VSS; and eleventh and twelfth NMOS transistors NM11 and NM12 arranged in series to control whether to connect the output terminal of the master signal with the ground voltage terminal in response to a signal of the eleventh node 11 and the signal PREC.

If the eleventh NMOS transistor NM11 and the twelfth NMOS transistor NM12 are turned on, the master signal is maintained at low level.

The third latch 130 can include two PMOS transistors while the fourth latch 131 can include two NMOS transistors.

As described above, data stored in the fifth and sixth ferroelectric capacitors FC5 and FC6 are opposite to each other. The seventh, eighth and ninth ferroelectric capacitors FC7, FC8, and FC9 serve as capacitance loading elements required to sense and read the stored data.

The redundancy master cell is operated in response to the signals ENN, ENP, EQN, CPL, ENW<n> used in the redundancy coding cell. The signal PREC has a path different from that of the master signal.

Also, since the VCC is always transferred to the drain terminal of the eighth NMOS transistor NM8 and the VSS is always transferred to the drain terminal of the ninth NMOS transistor NM9, high data is stored in the eleventh node while the low data is stored in the twelfth node during redundancy operation.

Therefore, the master signal may be maintained at low level or high level by the signal PREC during redundancy. In case of no redundancy operation, since the eleventh node is maintained at low level, the eleventh NMOS transistor NM11 is always turned off.

The signal PREC is maintained at high level in an active period where the chip enable signal CSB is low, so that the twelfth NMOS transistor NM12 is activated. While the signal PREC is maintained at low level in a precharge period, so that the twelfth NMOS transistor NM12 is inactivated.

Before the high data and the low data are respectively written in the ferroelectric capacitors FC5 and FC6, the capacitance load of the eleventh node N11 increases so that the low data is always stored in the eleventh node N11.

To increase the capacitance load of the eleventh node N11, the whole size of the ferroelectric capacitors FC7 and FC8 is designed to be greater than the size of the ferroelectric capacitor FC9.

The difference value in the capacitance load should not be affected by destructive charges when high data is stored in one node of the ferroelectric capacitor FC5.

In other words, if high charge of the ferroelectric capacitor FC5 is supplied to the eleventh node N11, a voltage level of the eleventh node N11 is higher than that of the twelfth node N12 even though the eleventh node N11 has a greater capacitance load than the capacitance load of the twelfth node N12.

The redundancy IO coding cell will be described with reference to FIG. 14.

As shown in FIG. 14, the redundancy IO coding cell can include a fail IO register 140 and a fail IO switching block 141 and determines whether to connect MIO<r> to RIO<q> in response to the signals ENN, ENP, EQN, CPL, ENW<n>, FION<r>, and FIONB<r>.

The fail IO register 140 can include a third PMOS transistor PM3 transferring the power source voltage VCC to a thirteenth node N13 in response to the signal ENP; a fifth latch 142 having one node connected with the thirteenth node N13 and the other node connected with fourteenth and fifteenth nodes N14 and N15; a third NMOS switch S3 controlling whether to connect the fourteenth node N14 with the fifteenth node N15 in response to the signal EQN; a thirteenth NMOS transistor NM13 having a gate terminal to which the signal ENW<n> is input, a source terminal to which a signal of the fourteenth node N14 is transferred, and a drain terminal to which a fail IO signal FION<r> is input; a fourteenth NMOS transistor NM14 having a gate terminal to which the signal ENW<n> is input, a source terminal to which a signal of the fifteenth node N15 is transferred, and a drain terminal to which the fail IO signal FIONB<r> is input; a seventeenth NMOS transistor NM17 transferring the ground voltage VSS to a sixteenth node N16 in response to the signal ENN; a sixth latch 143 having one node connected with the sixteenth node N16 and the other node connected with seventeenth and eighteenth nodes N17 and N18; an eleventh ferroelectric capacitor FC11 arranged between the input terminal of the signal CPL and the eighteenth node N18; a twelfth ferroelectric capacitor FC12 arranged between the seventeenth node N17 and the ground voltage terminal VSS; and a thirteenth ferroelectric capacitor FC13 arranged between the eighteenth node N18 and the ground voltage terminal VSS.

The fail IO switching block 141 can include a fourth PMOS transistor PM4 and a sixteenth NMOS transistor NM16 turned on/off in response to the signal of the seventeenth node N17, a fifteenth NMOS transistor NM15 and a fifth PMOS transistor PM5 turned on/off in response to the signal of the eighteenth node N18, and a transmission gate connecting one of the buses MIO<r> and RIO<q> to the bus IO<r> in response to the signals RPUL<n> and RPULB<n>.

The fifteenth NMOS transistor NM15 and the sixteenth NMOS transistor are always disconnected from each other, and the fourth PMOS transistor and the fifth PMOS transistor are always disconnected from each other.

In other words, one of MIO<r> and RIO<r> is connected with IO by the operation of the transmission gate.

The fifth latch 142 can include two PMOS transistors while the sixth latch 143 can include two NMOS transistors.

Data stored in the tenth and eleventh ferroelectric capacitors FC10 and FC11 are opposite to each other. The twelfth and thirteenth ferroelectric capacitors FC12 and FC13 serve as capacitance loading elements required to sense and read the stored data.

A method for repairing a failed column of a nonvolatile ferroelectric memory device according to the present invention will be described with reference to FIGS. 15, 16, and 17.

The operation of the nonvolatile ferroelectric memory device will be described in a power supply mode a built-in self test (BIST) mode.

Figure 15:
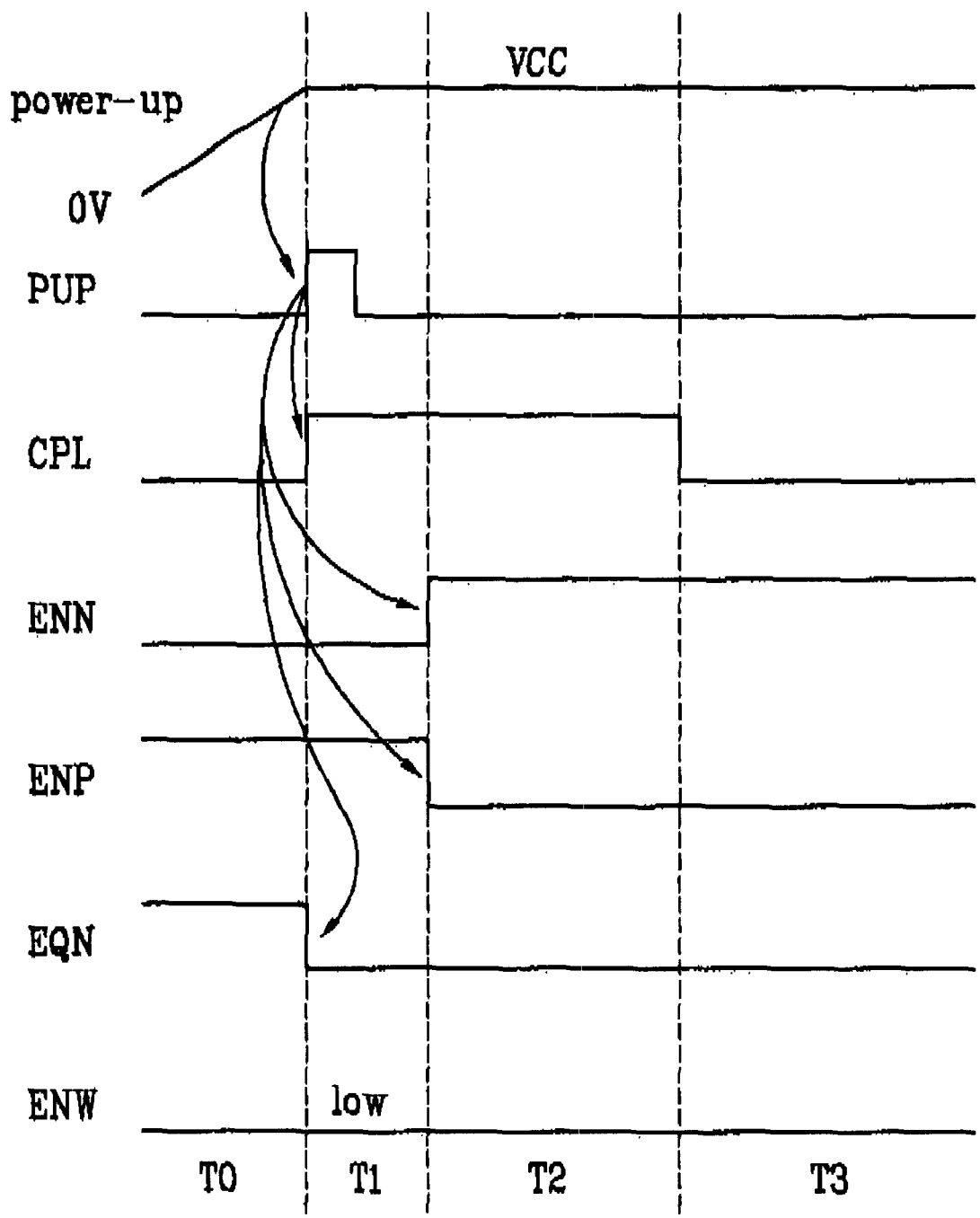
FIG. 15 is a timing chart illustrating the operation of the redundancy coding cell, the redundancy master cell, and the redundancy IO coding cell in a power-up mode.

First, the power supply mode, as shown in FIG. 15, is operated when a power-up mode is at a high level. The power supply mode can sense data stored in a redundancy cell.

Figure 16:
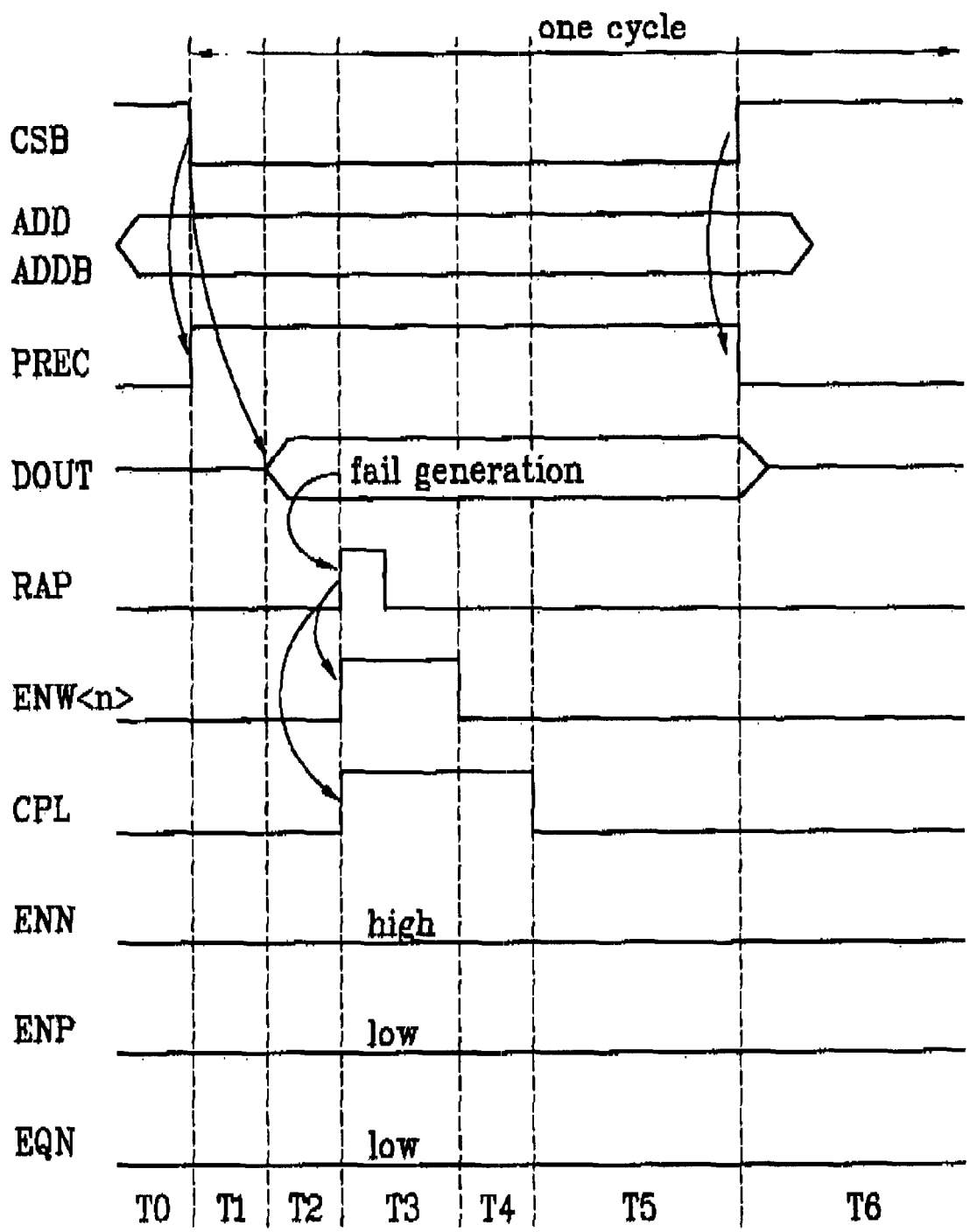
FIG. 16 is a timing chart illustrating the operation of the redundancy coding cell, the redundancy master cell, and the redundancy IO coding cell in a fail bit program.
Figure 17:
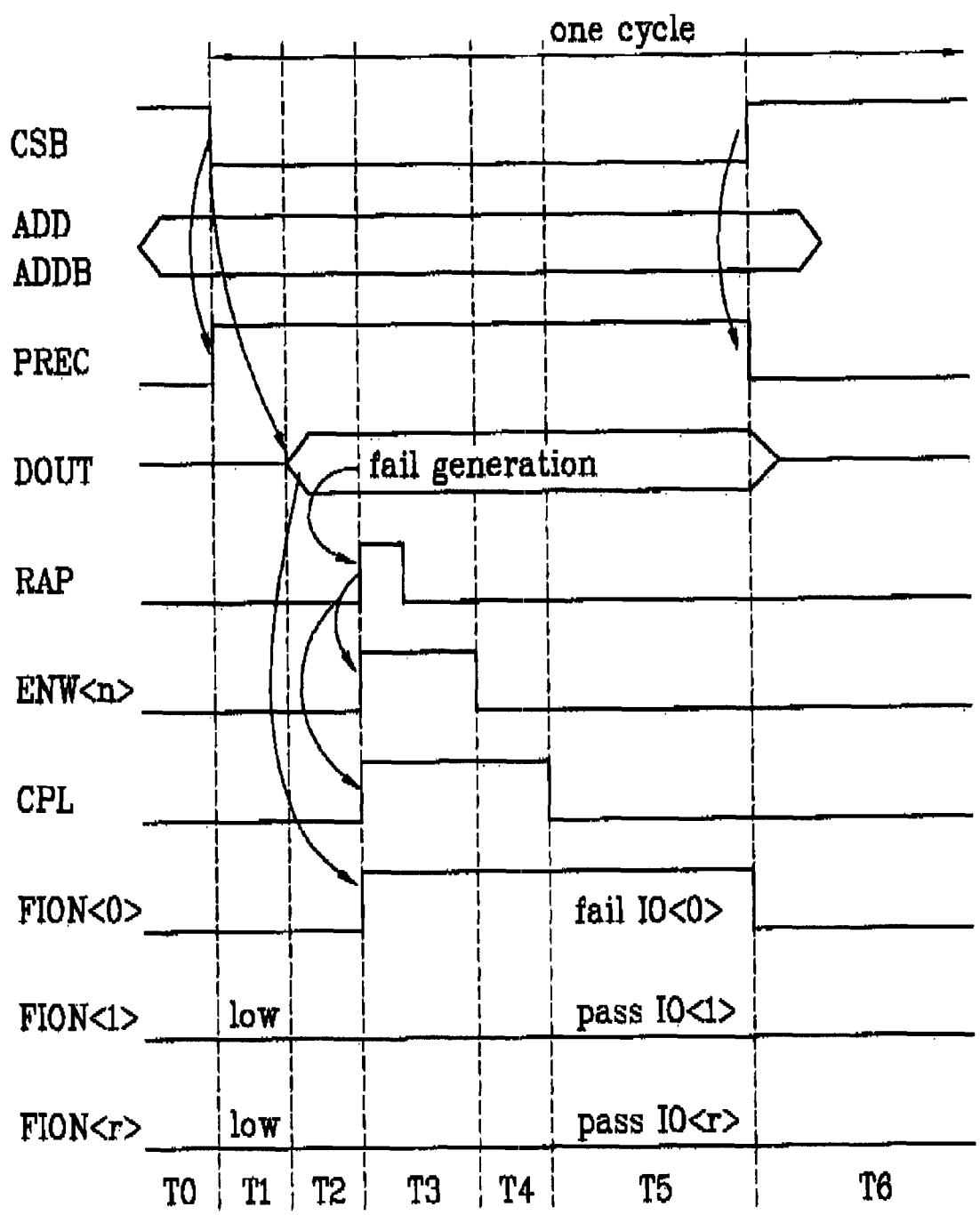
FIG. 17 is a timing chart illustrating the operation for generation of FION<r>.

The operation of storing fail column address and fail IO data generated during the BIST mode in the redundancy cell is shown in FIGS. 16 and 17.

In the power supply mode, as shown in FIG. 15, a power-up sensing pulse PUP is generated if the power up supply reaches a stable level. If the PUP is generated, the EQN is transited from high level to low level so that the CPL is transited from low level to high level.

The charges stored in the first and second ferroelectric capacitors FC1 and FC2 of FIG. 12 generate the voltage difference in both nodes of the cell, i.e., the fifth and sixth nodes by the capacitance load of the third and fourth ferroelectric capacitors FC3 and FC4.

Furthermore, the charges stored in the fifth and sixth ferroelectric capacitors FC5 and FC6 of FIG. 13 generate the voltage difference in both nodes of the cell, i.e., the eleventh and twelfth nodes by the capacitance load of the seventh, eighth, and ninth ferroelectric capacitors FC7, FC8, and FC9.

The charges stored in the tenth and eleventh ferroelectric capacitors FC10 and FC11 of FIG. 14 generate the voltage difference in both nodes of the cell, i.e., the seventh and eighteenth nodes by the capacitance load of the twelfth and thirteenth ferroelectric capacitors FC12 and FC13.

Afterwards, if the voltage difference is generated between the fifth and sixth nodes, between the eleventh and twelfth nodes, and between the seventeenth and eighteenth nodes, the ENN and the ENP are respectively activated at high level and low level, data at both ends of the cell are amplified.

If the data at both ends of the cell are amplified, the CPL is transited to low level again so that the destructed high data of the ferroelectric capacitor FC1 or FC2 are recovered.

At this time, the ENW<n> is inactivated at low level so that external data is prevented from being written.

Next, in the BIST mode, whether a fail bit has been generated in the nonvolatile ferroelectric memory device is tested. If the fail bit has been generated, a method for repairing the fail bit will be described with reference to FIGS. 16 and 17.

As shown in FIGS. 4, 16, and 17, a nonvolatile ferroelectric memory device 40 (FRAM) is tested. If the fail bit is generated, the RAP and the FION<r> are generated in the memory test logic block 41.

The first redundancy control block 44 that receives the RAP generates the CPL signal of high level while the redundancy counter decoding control block 45 generates the signal ENW<n> of high level.

At this time, the ENN is output at high level, the ENP at low level, and the EQN at low level.

The counter 42 that received the RAP from the memory test logic block 41 outputs a counting signal to the counter output coding bus 51.

The redundancy counter decoding control block 45 that received the ENW from the first redundancy control block 44 and the counting signal from the counter 42 outputs ENW<n> of high level to a corresponding redundancy coding block 46.

The existing data at both ends of the cells N5, N6, N17, and N18 are changed to a corresponding fail column address data and a corresponding fail IO FION<r>.

The redundancy column address coding block of a corresponding redundancy coding block, as shown in FIGS. 6 and 8, the RPUL<n> is output through the redundancy master cell 80 and a plurality of the redundancy coding cells.

At this time, the redundancy master cell 80, the plurality of redundancy coding cell, and the redundancy IO coding cells receive the signals ENN, PREC, and CPL at high level and the signals ENP, EQN, ADD, and ADDB at low level from the first redundancy control block 44, and receive the signal ENW<n> having a certain width at high level from a corresponding redundancy counter decoding control block 45.

The redundancy master cell 80, as shown in FIG. 13, outputs a master signal through the circuit of FIG. 13 before outputting the RPUL<n>. The redundancy coding cells, as shown in FIG. 12, code failed redundancy cells through the circuit of FIG. 12.

When the existing data is changed to a corresponding fail column address data and a corresponding IO data FION<r> as the fail bit is generated, the fail column address data is stored in the redundancy coding cell of FIGS. 8 and 12, the redundancy master cell is activated using the circuit of FIG. 13, and the bus RIO<q> is connected with the bus IO<r> using the redundancy IO coding cells of FIG. 14.

For example, when the fail column address is high, the ADD is high while the ADDB is low.

If the first and second NMOS transistors NM1 and NM2 are turned on by the signal ENW<n> of high level, high data and low data are respectively stored in the first and second ferroelectric capacitors FC1 and FC2.

At this time, if a corresponding fail address is input after redundancy coding, the fifth node N5 and the ADD become high level, so that the third and sixth NMOS transistors NM3 and NM6 are turned on. Thus, the RS1 and the RS2 are under low resistance state in which they are electrically connected with each other.

By contrast, if an address other than the corresponding fail address is input, the fifth node N5 is maintained at high level while the ADD is maintained at low level, so that the third NMOS transistor NM3 is turned off while the sixth NMOS transistor NM6 is turned on. Thus, the RS1 and the RS2 are under a high resistance state in which they are not electrically connected with each other.

If the fail column address is low, the ADD becomes low while the ADDB becomes high.

If the ENW<n> activated at high level is input, the first and second NMOS transistors NM1 and NM2 are turned on so that low data and high data are respectively stored in the first and second ferroelectric capacitors FC1 and FC2.

If a corresponding fail address is input after redundancy coding, the sixth node N6 and the ADDB become high level, so that the fourth and seventh NMOS transistors NM4 and NM7 are turned on. Thus, the RS1 and the RS2 are under a low resistance state in which they are electrically connected with each other.

By contrast, if an address other than the corresponding fail address is input, the sixth node N6 is maintained at high level while the ADDB is maintained at low level, so that the fourth NMOS transistor NM4 is turned off while the seventh NMOS transistor NM7 is turned on. Thus, the RS1 and the RS2 are under a high resistance state in which they are not electrically connected with each other.

Therefore, the corresponding fail column address can be coded.

The output of the master signal will be described with reference to FIG. 13.

The redundancy master cell can be operated in response to the signals ENN, ENP, EQN, CPL, and ENW<n> used in the redundancy coding cell. The signal PREC has a path different from that of the master signal.

Since the VCC is always transferred to the drain terminal of the eighth NMOS transistor NM8 and the VSS is always transferred to the drain terminal of the ninth NMOS transistor NM9, the ENW<n> is maintained at high level during redundancy. Thus, high data is stored in the eleventh node while low data is stored in the twelfth node, so that the eleventh NMOS transistor NM11 is turned on.

Therefore, the master signal may be maintained at low level or high level by the signal PREC during redundancy. However, in case of no redundancy, since the eleventh node is maintained at low level, the eleventh NMOS transistor NM11 is always turned off. Accordingly, the master signal is maintained at low level.

The signal PREC is maintained at high level in the active period where the chip enable signal CSB is low, so that the twelfth NMOS transistor NM12 is activated. While the signal PREC is maintained at low level in the precharge period, so that the twelfth NMOS transistor NM12 is inactivated.

In other words, in case where redundancy operation is generated in the active period where the chip enable signal CSB is low, the eleventh and twelfth NMOS transistors NM11 and NM12 are turned on so that the master signal is maintained at low level and the failed column address data can be coded in the redundancy coding cell.

The operation of coding a fail IO using the redundancy IO coding cell will be described.

As shown in FIGS. 6, 10, 14, and 17, if corresponding fail IOs are generated in the memory test logic block 41, FION<r> and FIONB<r> corresponding to the fail IOs are input to the redundancy IO coding cells of the redundancy IO multiplexer coding block 61, the FIONB<r> having a polarity opposite to the FION<r>. In this case, the FION<r> is maintained at high level while the FIONB<r> is maintained at low level.

The redundancy IO multiplexer coding block 61 outputs the RPUL<n> to the redundancy coding cells in response to the RPUL<n> output from the redundancy column address coding block 60 and at the same time outputs RPULB<n> having a polarity opposite to the RPUL<n> through the fourth inverter IN4.

If the ENW<n> of high level is generated in a state that the FION<r> and the FIONB<r> are input, the FION<r> and the FIONB<r> are transferred to the seventeenth and eighteenth nodes N17 and N18 through the thirteenth and fourteenth NMOS transistors NM13 and NM14. Also, high data and low data are stored in the tenth and eleventh ferroelectric capacitors FC10 and FC11 by the signal CPL.

Once high data and low data are transferred to the seventeenth and eighteenth nodes N17 and N18, the sixteenth NMOS transistor NM16 and the fifth PMOS transistor PM5 are turned on while the fifteenth NMOS transistor NM15 and the fourth PMOS transistor PM4 are turned off. As a result, the data path of the RIO<q> is only activated.

The RPUL<n> is maintained at high level and the RPULB<n> is maintained at low level during the fail column address. In this case, the transmission gate of FIG. 14 is activated. Therefore, the bus RIO<q> is connected with the bus IO<r>.

The existing data at both ends of the cells shown in FIGS. 12, 13, and 14 is changed to the fail address data and FION<r> while the ENW<n> is maintained at high level. The changed fail address data is stored in the ferroelectric capacitors FC1 and FC2. To store the fail IO data in the ferroelectric capacitors FC1 and FC2 and the fail IO data in the ferroelectric capacitors FC10 and FC11, as shown in FIGS. 12, 14, 16, and 17, when the ENW<n> is transited to low level after the CPL is transited to high level in the same manner as the ENW<n>, the CPL is transited to low level after a certain time period. This operation should be performed while the corresponding fail address and the fail IO are in active state during one cycle.

The second redundancy control block 70 that received the RPUL<n>, as shown in FIGS. 6 and 9, outputs the RIODIS to the normal IO path 67 in a normal operation mode. On the other hand, when the fail address is generated, the second redundancy control block 70 outputs the WLRHR<q> to the redundancy amplifier 64 in response to the signal WLRH, so as to select a cell for redundancy through the redundancy column selection block 71.

The aforementioned column repair circuit and method of a nonvolatile ferroelectric memory device according to the present invention has the following advantages.

First, no analysis step of the fail bit is required. If the fail bit is generated during the column address test, the failed column address is directly repaired. Accordingly, the test and redundancy time can be reduced.

Second, since the ferroelectric capacitor constituting the redundancy coding cell is formed in the same process of forming a memory cell, the process can be simplified.

Finally, since the redundancy algorithm can be applied regardless of the chip type such as the wafer type or the package type, it is possible to change or add the redundancy algorithm at any time. Furthermore, since the fail bit generated during the memory test can directly be repaired, the column repair circuit of the present invention can be used for an embedded FRAM.

It will be apparent to those skilled in the art that various modifications and variations can be made in the column repair circuit and method of a nonvolatile ferroelectric memory device of the present invention without departing from the spirit or scope of the inventions. Thus, it is intended that the present invention covers the modifications and variations of this invention provided they come within the scope of the appended claims and their equivalents.

What is claimed is:

1. A column repair circuit of a nonvolatile ferroelectric memory device having a repair logic unit therein, the column repair circuit comprising:

a memory test logic block configured to generate a redundancy active pulse (RAP) and a corresponding fail input/output (IO) number FION<r> if a column address including a fail bit to be repaired is found during test;

a power-up sensor configured to generate a power-up pulse if a stable power source voltage is sensed;

a first redundancy control block configured to generate first to fifth control signals ENN, ENP, EQN, CPL, and PREC and a sixth control signal ENW in response to the RAP and the power-up pulse;

a counter configured to generate n bit counter bit signal increased by one bit through the RAP to correspond to the number of redundancy bits;

a redundancy counter decoding control block configured to generate an activated coding signal ENW<n> in response to the counter bit signal of the counter and the sixth control signal ENW; and a redundancy coding block configured to code a fail column address in response to the coding signal ENW<n>, the first to fifth control signals, the first and second address signals ADD and ADDB, and the fail IO number FION<r>, and coding a fail IO bus.

2. The column repair circuit of claim 1, further comprising:
- a counter output coding bus that codes the counter bit signal output from the counter; and
- a first NAND gate block including a plurality of NAND gates that perform logic AND operation of the coding signal from the counter output coding bus and invert the resultant value.

3. The column repair circuit of claim 2, wherein the redundancy counter decoding control block comprises:
- a first to nth redundancy counter decoding control blocks, each redundancy counter decoding control block including:
  - a first inverter block including a plurality of inverters inverting an output signal of each NAND gate of the first NAND gate block;
  - a second NAND gate block including a plurality of NAND gates performing logic AND operation of an output signal of each inverter of the first inverter block and inverting the resultant value; and
  - a second inverter block including a plurality of inverters inverting an output signal of each NAND gate of the second NAND gate block and outputting the activated coding signal ENW<n>.

4. The column repair circuit of claim 1, wherein the redundancy coding block comprises:
- a redundancy column address coding block configured to generate a seventh control signal RPUL<n> for controlling a fail repair in response to the first to fifth control signals ENN, ENP, EQN, CPL, and PREC, and the activated coding signal ENW<n>;
- a redundancy IO multiplexer coding block replacing one of main IO buses MIO<r> with a redundancy IO bus RIO<q> and configured to connect the redundancy input/output bus RIO<q> with a data IO bus IO<r> in response to the seventh control signal RPUL<n>, the first to fifth control signals ENN, ENP, EQN, CPL, and PREC, the activated coding signal ENW<n>, and the fail IO number FION<r>; and
- a second redundancy control block configured to generate a ninth control WLRH that controls the operation of a redundancy amplifier and a tenth control signal RIO-DIS that controls a normal IO path during a normal operation mode, in response to the seventh control signal RPUL<n> and an eighth control signal WLRH that controls read/write modes of a data bus.

5. The column repair circuit of claim 4, wherein the redundancy column address coding block comprises:
- a redundancy master cell configured to determine whether to activate or inactivate a plurality of redundancy coding cells in response to the first to fifth control signals ENN, ENP, EQN, CPL, and PREC and the activated coding signal ENW<n>;
- a redundancy coding cell block having the plurality of redundancy coding cells arranged in row direction to store an actual fail address in response to the first to fourth control signals ENN, ENP, EQN, and CPL and the activated coding signal ENW<n>;
- a first NOR gate performing logic OR operation of output signals of the row direction according to on/off state of the redundancy coding cells and configured to invert the resultant value;
- a first inverter configured to invert a signal of the first NOR gate;
- a second inverter configured to invert a signal of the first inverter and configured to output the second control signal RPUL<n>; and
- PMOS transistors respectively arranged in final output terminals of the redundancy coding cells connected in the row direction.

6. The column repair circuit of claim 5, wherein the redundancy coding cells comprise:
- a first PMOS transistor PM1 transferring a power source voltage VCC to a first node N1 in response to the second control signal ENP;
- a first latch having one node connected with the first node N1 and the other node connected with second and third nodes N2 and N3;
- a first NMOS switch S1 controlling whether to connect the second node N2 with the third node N3 in response to the third control signal EQN;
- a first NMOS transistor NM1 having a gate terminal to which the coding signal ENW<n> is input, a source terminal to which a signal of the second node N2 is transferred, and a drain terminal to which the first address signal ADD is input;
- a second NMOS transistor NM2 having a gate terminal to which the coding signal ENW<n> is input, a source terminal to which a signal of the third node N3 is transferred, and a drain terminal to which the second address signal ADDB is input;
- third and fourth NMOS transistors NM3 and NM4 turned on/off depending on the first and second address signals ADD and ADDB;
- a fifth NMOS transistor NM5 transferring the ground voltage VSS to a fourth node N4 in response to the first control signal ENN;
- a second latch having one node connected with the fourth node N4 and the other node connected with fifth and sixth nodes N5 and N6;
- a first ferroelectric capacitor FC1 arranged between an input terminal of the fourth control signal CPL and the fifth node N5;
- a second ferroelectric capacitor FC2 arranged between the input terminal of the fourth control signal CPL and the sixth node N6;
- a third ferroelectric capacitor FC3 arranged between the fifth node N5 and the ground voltage terminal VSS;
- a fourth ferroelectric capacitor FC4 arranged between the sixth node N6 and the ground voltage terminal VSS; and
- sixth and seventh NMOS transistors NM6 and NM7 turned on/off under the control of signals of the fifth and sixth nodes N5 and N6.

7. The column repair circuit of claim 5, wherein the redundancy master cell comprises:
- a second PMOS transistor PM2 configured to transfer the power source voltage VCC to a seventh node N7 in response to the second control signal ENP;
- a third latch having one node connected with the seventh node N7 and the other node connected with eighth and ninth nodes N8 and N9;
- a second NMOS switch S2 configured to connect the eighth node N8 with the ninth node N9 in response to the third control signal EQN;
- an eighth NMOS transistor NM8 having a gate terminal to which the coding signal ENW<n> is input, a drain terminal to which a signal of the eighth node N8 is transferred, and a source terminal to which the power source voltage is input;

a ninth NMOS transistor NM9 having a gate terminal to which the coding signal ENW<n> is input, a source terminal to which a signal of the ninth node N9 is transferred, and a drain terminal to which the ground voltage VSS is input;

a tenth NMOS transistor NM10 configured to transfer the ground voltage VSS to a tenth node N10 in response to the first control signal ENN;

a fourth latch having one node connected with the tenth node N10 and the other two nodes connected with the eleventh and twelfth nodes N11 and N12;

a fifth ferroelectric capacitor FC5 arranged between the input terminal of the fourth control signal CPL and the eleventh node N11;

a sixth ferroelectric capacitor FC6 arranged between the input terminal of the fourth control signal CPL and the twelfth node N12;

seventh and eighth ferroelectric capacitors FC7 and FC8 arranged in parallel between the eleventh node N11 and the ground voltage terminal VSS;

a ninth ferroelectric capacitor FC9 arranged between the twelfth node N12 and the ground voltage terminal VSS; and eleventh and twelfth NMOS transistors NM11 and NM12 arranged in series between an output terminal of a master signal and the ground voltage terminal under the control of the eleventh node N11 and the fifth control signal PREC.

8. The column repair circuit of claim 4, wherein the redundancy IO multiplexer coding block comprises:

a fourth inverter IN4 inverting the seventh control RPUL<n> and outputting RPULB<n>; and a plurality of redundancy IO coding cells selectively configured to input a data input/output bus IO<r> to a main input/output bus MIO<r> or redundancy input/output bus RIO<q> in response to the coding signal ENW<n>, the first to fifth control signals ENN, ENP, EQN, CPL, and PREC, the seventh control signal RPUL<n>, the signal RPULB<n>, and the fail IO number FION<r>.

9. The column repair circuit of claim 8, wherein the redundancy IO coding cell comprises:

a third PMOS transistor PM3 configured to transfer the power source voltage VCC to a thirteenth node N13 in response to the signal ENP;

a fifth latch having one node connected with the thirteenth node N13 and the other node connected with fourteenth and fifteenth nodes N14 and N15;

a third NMOS switch S3 configured to connect the fourteenth node N14 with the fifteenth node N15 in response to the third control signal EQN;

a thirteenth NMOS transistor NM13 having a gate terminal to which the coding signal ENW<n> is input, a source terminal to which a signal of the fourteenth node N14 is transferred, and a drain terminal to which a fail IO signal FION<r> is input;

a fourteenth NMOS transistor NM14 having a gate terminal to which the coding signal ENW<n> is input, a source terminal to which a signal of the fifteenth node N15 is transferred, and a drain terminal to which the fail IO signal FIONB<r> is input;

a seventeenth NMOS transistor NM17 transferring the ground voltage VSS to a sixteenth node N16 in response to the first control signal ENN;

a sixth latch having one node connected with the sixteenth node N16 and the other node connected with seventeenth and eighteenth nodes N17 and N18;

a tenth ferroelectric capacitor FC10 arranged between the input terminal of the fourth control signal CPL and the seventeenth node N17;

an eleventh ferroelectric capacitor FC11 arranged between the input terminal of the fourth control signal CPL and the eighteenth node N18;

a twelfth ferroelectric capacitor FC12 arranged between the seventeenth node N17 and the ground voltage terminal VSS;

a thirteenth ferroelectric capacitor FC13 arranged between the eighteenth node N18 and the ground voltage terminal VSS;

a fourth PMOS transistor PM4 and a sixteenth NMOS transistor NM16 turned on/off in response to a signal of the seventeenth node N17;

a fifteenth NMOS transistor NM15 and a fifth PMOS transistor PM5 turned on/off in response to a signal of the eighteenth node N18; and a transmission gate connecting one of the buses MIO<r> and RIO<q> to the bus IO<r> in response to the seventh control signal RPUL<n> and its inverted signal RPULB<n>.

10. The column repair circuit of claim 4, wherein the second redundancy control block comprises:

a first NOR gate block including a plurality of three input NOR gates;

a second NOR gate block including a plurality of NOR gates performing logic OR operation of an output signal of each NOR gate of the first NOR gate block and the eighth control signal WLRH, and inverting the resultant value;

a first NAND gate and a third inverter connected in series to output the tenth control signal RIODIS that controls a normal input/output path block in response to the output signal of each NOR gate of the first NOR gate block; and an inverter block including a plurality of inverters inverting the signal of each NOR gate of the second NOR gate block to output an eleventh control signal that controls reading/writing operation of the redundancy amplifier.

11. A column repair method of a nonvolatile ferroelectric memory device having a repair logic unit therein, the column repair method comprising:

generating a redundancy active pulse (RAP) and a corresponding fail input/output (IO) number FION<r> in a memory test logic block if a column address including a fail bit to be repaired is found during test;

generating a power-up pulse in a power-up sensor if a stable power source voltage is sensed;

generating first to fifth control signals ENN, ENP, EQN, CPL, and PREC and a sixth control signal ENW in response to the RAP and the power-up pulse;

generating n bit counter bit signal in a counter, the n bit counter bit signal being increased by one bit through the RAP to correspond to the number of redundancy bits;

generating an activated coding signal ENW<n> in response to the counter bit signal of the counter and the sixth control signal ENW; and coding a fail column address in a redundancy coding block that received the coding signal ENW<n>, the first to fifth control signals, the first and second address signals ADD and ADDB, and the fail IO number FION<r>, and coding a fail IO bus.

12. The column repair method of claim 11, wherein coding of the fail column address and coding of the fail IO bus can include:

programming the column address containing a corresponding fail bit in a redundancy column address coding block including a redundancy master cell and a redundancy coding cell, in response to the first to fifth control signals ENN, ENP, EQN, CPL, and PREC, the activated coding signal ENW<n>, and the first and second address signals ADD and ADDB, the redundancy master cell and the redundancy coding cell respectively having ferroelectric capacitors;

outputting a seventh control signal RPUL<n> from the redundancy column address coding block to repair a fail if the programmed column address containing a corresponding fail bit is input; and inputting the seventh control signal RPUL<n>, the first to fifth control signals ENN, ENP, EQN, CPL, and PREC, the activated coding signal ENW<n>, and the fail IO number to the redundancy IO multiplexer coding block and replacing one of a plurality of main input/output buses MIO<r> with a redundancy input/output bus RIO<q> to connect it with a data input/output bus IO<r>.

13. The column repair method of claim 11, wherein the fail column address is repaired in an active period where a chip enable signal is activated at low level and a period where the fifth control signal PREC is maintained at high level.

14. The column repair method of claim 11, wherein the first control signal ENN is maintained at high level while the second third control signals EPN and EQN are maintained at low level when the fail column address is coded.

15. The column repair method of claim 12, wherein the fail column address is coded in such a manner that the coding signal ENW<n> is maintained at high level, the fourth control signal PREC is output at high level, the redundancy master cell outputs a master signal of low level, and first and second output terminals RS1 and RS2 of the respective redundancy coding cells are connected with each other.

16. The column repair method of claim 15, wherein the first and second output terminals of the redundancy coding cell are connected with each other in case of the fail column address of high level in such a manner that the coding signal ENW<n> and the fourth control signal CPL are maintained at high level if the programmed fail column address is input, the first address signal ADD and one node of a first ferroelectric capacitor are maintained at high level, and the second address signal ADDB and one node of a second ferroelectric capacitor are maintained at low level.

17. The column repair method of claim 15, wherein the first and second output terminals of the redundancy coding cell are connected with each other in case of the fail column address of low level in such a manner that the coding signal ENW<n> and the fourth control signal CPL are maintained at high level if the programmed fail column address is input, the first address signal ADD and one node of a first ferroelectric capacitor are maintained at low level, and the second address signal ADDB and one node of a second ferroelectric capacitor are maintained at low level.

18. The column repair method of claim 11, wherein the step of replacing one of a plurality of main input/output buses MIO<r> with a redundancy input/output bus RIO<q> to connect it with a data input/output bus IO<r> is performed in such a manner that the fail IO number FION<r> is output at high level, the coding signal ENW<n> and the fourth control signal CPL are maintained at high level, the fourth control signal CPL is transferred to one node of a tenth ferroelectric capacitor and one node of an eleventh ferroelectric capacitor, the other node of the tenth ferroelectric capacitor is maintained at high level, the other node of the eleventh ferroelectric capacitor is maintained at low level, and the seventh control signal RPUL<n> is maintained at high level.

19. A column repair circuit of a nonvolatile ferroelectric memory device having a repair logic unit therein, the column repair circuit comprising:

a memory test logic means for generating a redundancy active pulse (RAP) and a corresponding fail input/output (IO) number FION<r> if a column address including a fail bit to be repaired is found during test;

a power-up sensor means for generating a power-up pulse if a stable power source voltage is sensed;

a first redundancy control means for generating first to fifth control signals ENN, ENP, EQN, CPL, and PREC and a sixth control signal ENW in response to the RAP and the power-up pulse;

a counter means for generating n bit counter bit signal increased by one bit through the RAP to correspond to the number of redundancy bits;

a redundancy counter decoding control means for generating an activated coding signal ENW<n> in response to the counter bit signal of the counter and the sixth control signal ENW; and a redundancy coding means for coding a fail column address in response to the coding signal ENW<n>, the first to fifth control signals, the first and second address signals ADD and ADDB, and the fail IO number FION<r>, and coding a fail IO bus.

20. A coding cell of a nonvolatile ferroelectric memory device, comprising:

a PMOS transistor transferring a power source voltage VCC to a first node in response to a first control signal;

a first latch having one node connected with the first node and the other node connected with second and third nodes;

a first transistor having a gate terminal to which a gate control signal is input, a source terminal to which a signal of the second node is transferred, and a drain terminal to which a first data signal is input;

a second transistor having a gate terminal to which the gate control signal is input, a source terminal to which a signal of the third node is transferred, and a drain terminal to which a second data signal is input;

a third transistor transferring a ground voltage VSS to a fourth node in response to a second control signal;

a second latch having one node connected with the fourth node and the other node connected with the second and third nodes;

a first ferroelectric capacitor arranged between an input terminal of a third control signal and the second node;

a second ferroelectric capacitor arranged between the input terminal of the third control signal and the third node;

a third ferroelectric capacitor arranged between the second node and a voltage terminal; and a fourth ferroelectric capacitor arranged between the third node and the voltage terminal.

21. The coding cell of claim 20, further comprising an equalizing block between the second and third nodes.

22. The coding cell of claim 20, further comprising a switching block operating in response to signals of the second and third nodes.

23. A coding cell of a nonvolatile ferroelectric memory device, comprising:
- a PMOS transistor transferring a power source voltage VCC to a first node in response to a first control signal;
- a first latch having one node connected with the first node and the other node connected with second and third nodes;
- a first transistor having a gate terminal to which a gate control signal is input, a source terminal to which a signal of the second node is transferred, and a drain terminal to which a first data signal is input;
- a second transistor having a gate terminal to which the gate control signal is input, a source terminal to which a signal of the third node is transferred, and a drain terminal to which a second data signal is input;
- a third transistor transferring a ground voltage VSS to a fourth node in response to a second control signal;
- a second latch having one node connected with the fourth node and the other node connected with the second and third nodes;
- a first ferroelectric capacitor arranged between an input terminal of a third control signal and the second node;
- a second ferroelectric capacitor arranged between the input terminal of the third control signal and the third node;
- third and fourth ferroelectric capacitors arranged in parallel between the second node and a voltage terminal; and
- a fifth ferroelectric capacitor arranged between the third node and the voltage terminal.

24. The coding cell of claim 23, further comprising a switching block operating in response to signals of the second and third nodes.

25. A coding cell of a nonvolatile ferroelectric memory device, comprising:
- a first latch having one node connected with a first node and the other node connected with second and third nodes;
- a first transistor having a gate terminal to which a gate control signal is input, a source terminal to which a signal of the second node is transferred, and a drain terminal to which a first data signal is input;
- a second transistor having a gate terminal to which the gate control signal is input, a source terminal to which a signal of the third node is transferred, and a drain terminal to which a second data signal is input;
- a switching block operating in response to signals of the second and third nodes;
- a second latch having one node connected with a fourth node and the other node connected with the second and third nodes;
- a first ferroelectric capacitor arranged between an input terminal of a control signal and the second node;
- a second ferroelectric capacitor arranged between the input terminal of the control signal and the third node;
- a third ferroelectric capacitor arranged between the second node and a voltage terminal; and
- a fourth ferroelectric capacitor arranged between the third node and the voltage terminal.

26. The coding cell of claim 25, further comprising an equalizing block between the second and third nodes.

27. The coding cell of claim 25, further comprising a switching block operating in response to signals of the second and third nodes.

28. A method for operating a coding cell of a nonvolatile ferroelectric memory device having first and second nodes between two latches, a first ferroelectric capacitor arranged between an input terminal of a control signal and the first node, a second ferroelectric capacitor arranged between the input terminal of the control signal and the second node, a third ferroelectric capacitor arranged between the first node and a voltage terminal, and a fourth ferroelectric capacitor arranged between the second node and the voltage terminal, comprising:
- sensing a voltage difference from first and second data stored in the first and second ferroelectric capacitors in response to power-up sensing pulse during a power-up mode;
- restoring the first data in the first ferroelectric capacitor in case of the control signal of logic "high" level, and restoring the second data in the second ferroelectric capacitor in case of the control signal of logic "low" level.

29. A method for operating a coding cell of a nonvolatile ferroelectric memory device having first and second nodes between two latches, a first ferroelectric capacitor arranged between an input terminal of a control signal and the first node, a second ferroelectric capacitor arranged between the input terminal of the control signal and the second node, a third ferroelectric capacitor arranged between the first node and a voltage terminal, and a fourth ferroelectric capacitor arranged between the second node and the voltage terminal,
- wherein a first data is stored in the first ferroelectric capacitor or the second ferroelectric capacitor in case of a gate control signal of logic "high" level and the control signal of logic "high" level during a write program mode and a second data is stored in the first ferroelectric capacitor or the second ferroelectric capacitor in case of the gate control signal of logic "low" level and the control signal of logic "low" level.

* * * * *